(12) United States Patent
Ishizuya

(10) Patent No.: US 12,082,474 B2
(45) Date of Patent: Sep. 3, 2024

(54) DISPLAY DEVICE AND ELECTRONIC DEVICE

(71) Applicant: CANON KABUSHIKI KAISHA, Tokyo (JP)

(72) Inventor: Koji Ishizuya, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/485,477

(22) Filed: Oct. 12, 2023

(65) Prior Publication Data
US 2024/0049553 A1 Feb. 8, 2024

Related U.S. Application Data

(63) Continuation of application No. 17/198,467, filed on Mar. 11, 2021, now Pat. No. 11,825,722.

(30) Foreign Application Priority Data

Mar. 24, 2020 (JP) .................................. 2020-053143

(51) Int. Cl.
*H10K 59/38* (2023.01)
*H10K 50/86* (2023.01)
(Continued)

(52) U.S. Cl.
CPC ........... *H10K 59/38* (2023.02); *H10K 50/865* (2023.02); *H10K 59/12* (2023.02); *H10K 2102/3026* (2023.02)

(58) Field of Classification Search
CPC ........ H10K 50/80; H10K 59/12; H10K 59/38; H01L 27/322; H01L 27/3244;
(Continued)

(56) References Cited

U.S. PATENT DOCUMENTS 8,604,490 B2  12/2013  Yuasa
8,748,875 B2   6/2014  Koresawa
(Continued)

FOREIGN PATENT DOCUMENTS

CN   1056295962 A   6/2016
JP   2004-085592 A  3/2004
(Continued)

OTHER PUBLICATIONS

Dec. 4, 2023 Japanese Official Action in Japanese Patent Appln. No. 2020-053143.
(Continued)

*Primary Examiner* — Wasiul Haider
(74) *Attorney, Agent, or Firm* — Venable LLP

(57) ABSTRACT

Display device has display region of pixels including first pixel arranged in central portion of the display region and second pixel arranged between the first pixel and the edge of the display region. Each pixel includes first and second light emitting elements. Color filter layer is arranged on the first and second light emitting elements. The first light emitting element includes first color filter, and opening of the first light emitting element is defined by the color filter layer. The second light emitting element includes second color filter and having spectral transmittance characteristic different from the first color filter. Ratio of size of the opening to size of light emitting region of the first light emitting element is smaller in the second pixel than in the first pixel.

16 Claims, 13 Drawing Sheets

(51) Int. Cl.
*H10K 59/12* (2023.01)
*H10K 102/00* (2023.01)

(58) Field of Classification Search
CPC ......... H01L 51/5284; H01L 2251/5315; H01L 27/3216; H01L 27/3211; H01L 27/32; H01L 27/3206
See application file for complete search history.

(56) References Cited

U.S. PATENT DOCUMENTS

| | | | |
|---|---|---|---|
| 9,530,828 | B2 | 12/2016 | Matsumi |
| 9,858,028 | B2 | 1/2018 | Ikeda |
| 10,592,193 | B2 | 3/2020 | Ikeda |
| 2011/0210348 | A1 | 9/2011 | Yuasa |
| 2012/0199856 | A1 | 8/2012 | Koresawa |
| 2014/0231790 | A1 | 8/2014 | Fujino |
| 2015/0084144 | A1* | 3/2015 | Suzuki .............. H01L 27/14647 438/70 |
| 2016/0019019 | A1 | 1/2016 | Ikeda |
| 2016/0079327 | A1 | 3/2016 | Matsumi |
| 2017/0301314 | A1 | 10/2017 | Kim et al. |
| 2018/0182814 | A1 | 6/2018 | Kim et al. |
| 2018/0196629 | A1 | 7/2018 | Ikeda |
| 2019/0056543 | A1 | 2/2019 | Ueda |
| 2020/0124911 | A1 | 4/2020 | Reeves et al. |
| 2021/0080637 | A1 | 3/2021 | Brick et al. |
| 2021/0118959 | A1 | 4/2021 | Sano et al. |
| 2022/0085114 | A1 | 3/2022 | Seong |

FOREIGN PATENT DOCUMENTS

| | | |
|---|---|---|
| JP | 2013-015680 A | 1/2013 |
| JP | 2013-030315 A | 2/2013 |
| JP | 2013-073884 A | 4/2013 |
| JP | 2016-029464 A | 3/2016 |
| WO | 2011/058596 A1 | 5/2011 |
| WO | 2011/108020 A1 | 9/2011 |
| WO | 2014/199745 A1 | 12/2014 |

OTHER PUBLICATIONS

Takuma Fujii, et al., "4032 ppi High-resolution OLED microdisplay," Journal of the SID 26/3 (2018), pp. 178-186.

* cited by examiner

FIG. 1
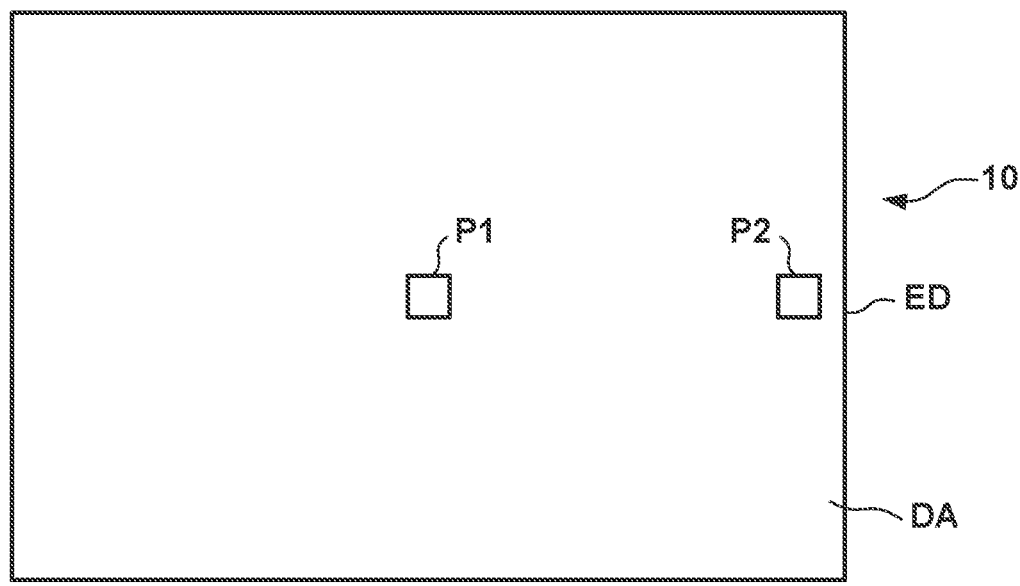
FIG. 2A
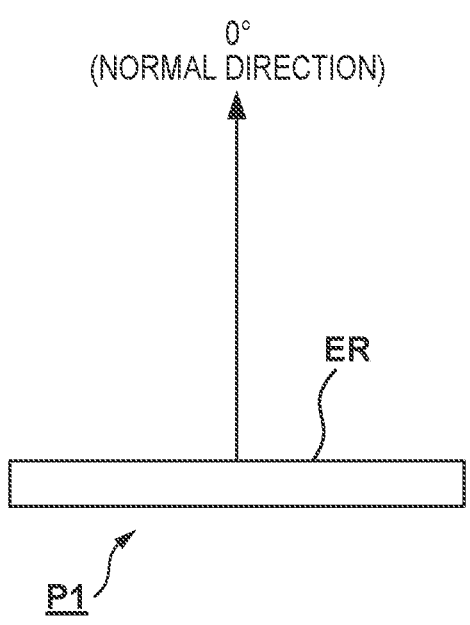
FIG. 2B
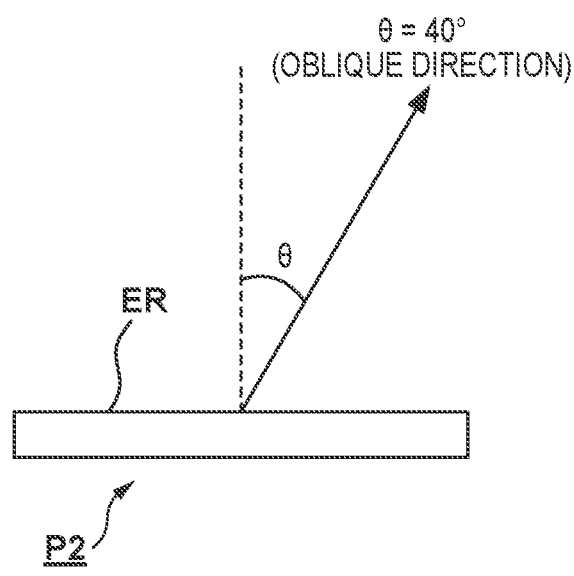
FIG. 2C
| COMPONENT | NORMAL DIRECTION (θ=0°) | OBLIQUE DIRECTION (θ=40°) |
|---|---|---|
| BLUE | 1.49 | 2.17 |
| GREEN | 1 | 1 |
| RED | 0.42 | 0.41 |

F I G. 14A
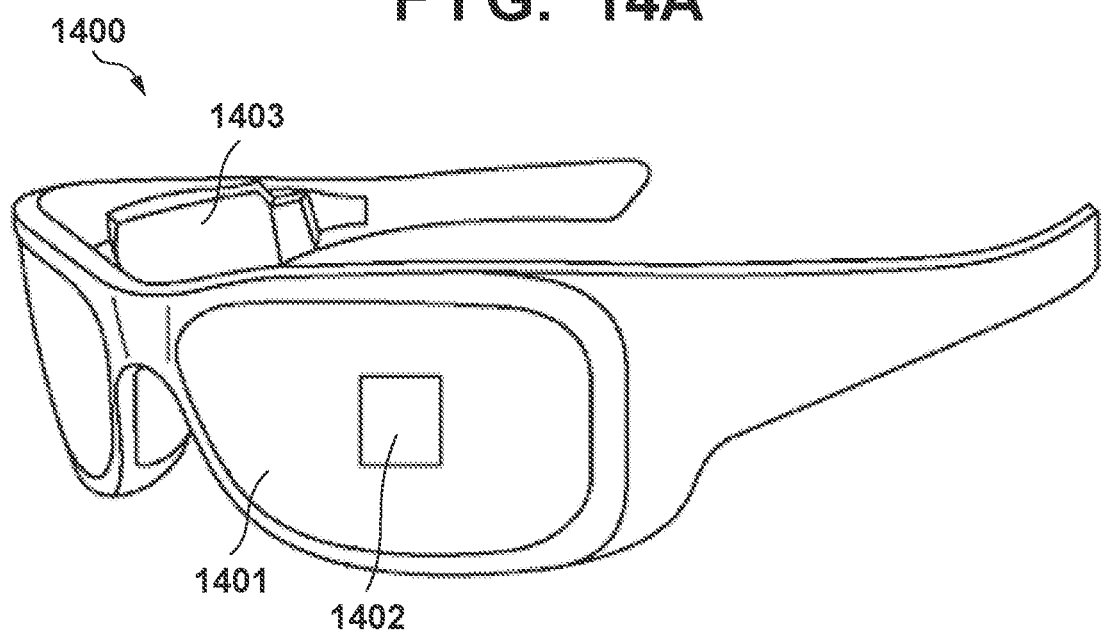
F I G. 14B
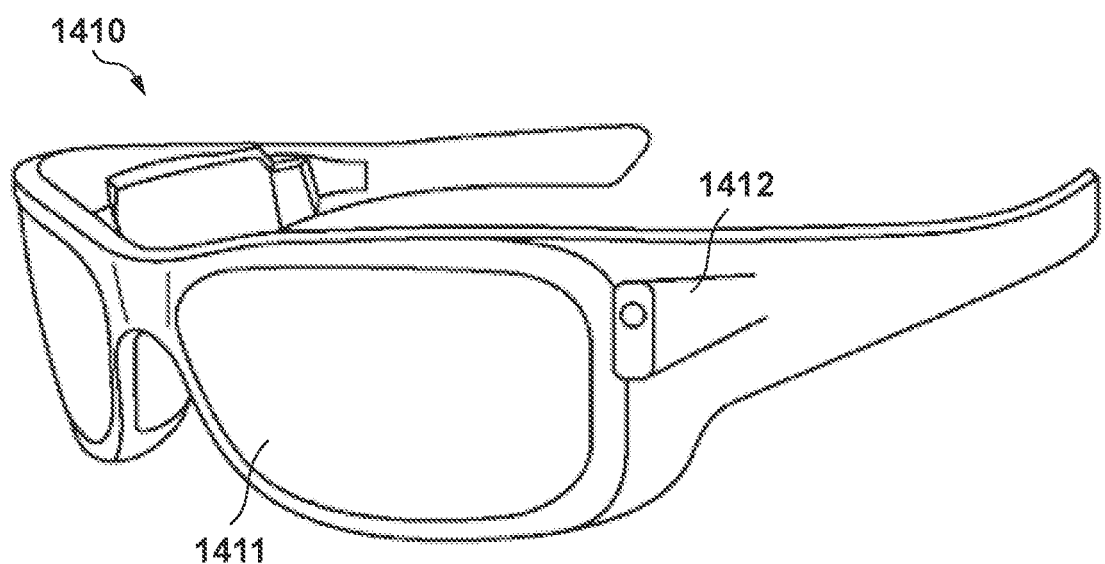

DISPLAY DEVICE AND ELECTRONIC DEVICE

This application is a continuation of application Ser. No. 17/198,467 filed Mar. 11, 2021.

BACKGROUND OF THE INVENTION

Field of the Invention

The present invention relates to a display device and an electronic device.

Description of the Related Art

An organic EL element is a light emitting element including a pair of electrodes, and an organic compound layer arranged between them and including a light emitting layer. Utilizing excellent characteristics such as a surface light emitting characteristic, light weight, and visibility, the organic EL element has been put into practical use as a light emitting device for a flat display, a lighting instrument, a head mounted display, or a printhead light source in an electrophotographic printer. In particular, demands for high-resolution organic EL display devices have increased, and a method (to be referred to as a white/CF method hereinafter) using a white organic EL element and color filters is known. The white/CF method is a method of installing a plurality of color filters with different wavelength dependences to light to be absorbed in the exit direction of white light emitted from the organic EL element. For example, when the color filters are formed such that emission colors after passing through the color filters become red, green, and blue, full color display by additive color mixing is possible. Since an organic compound layer need not be deposited on a light emitting pixel basis in the white/CF method, light emitting pixels of high resolution can easily be formed.

FIG. 9 shows an example in which an organic EL display device 10 is used together with a magnifying optical system 20. Dotted lines indicate light beams that exit from a display region 11 of the organic EL display device 10 and enter an eye 30 via the magnifying optical system. Concerning the central portion of the display region 11, the light beams exiting in the normal direction of the display region 11 are used. Concerning the peripheral portion of the display region 11, the light beams exiting in the oblique directions (directions tilting with respect to the normal direction) are used.

In a case in which the organic EL display device of the white/CF method is observed via the magnifying optical system, there is a problem of chromaticity unevenness in which chromaticity is different between the central portion and the peripheral portion of the display region 11. The factor of this problem is that the color of light beams exiting in the normal direction from the central portion of the display region 11 of the organic EL display device 10 and the chromaticity of light beams exiting in the oblique directions from the peripheral portion of the display region 11 are different from each other. As one of the factors, the intensity ratio of the red, green, and blue components of white light before passing through the color filters is different between the normal direction and the oblique directions. In this case, the emission intensity ratio of red, green, and blue sub-pixels after passing through the color filters also changes. Hence, for example, in light synthesized from the light components of a red pixel, a green pixel, and a blue pixel, like white display, the chromaticity is different between the front direction and the oblique directions.

Journal of SID 26/3, 2018 p. 178 (hereinafter NPTL 1) discloses an organic EL display device that suppresses chromaticity changes in oblique directions by adjusting the size of the color filter of each color and narrowing the substantial opening ratio of the color filters.

The display device described in NPTL 1 uses the method of narrowing the substantial opening ratio of the color filters by adjusting the size of the color filter of each color. When this method is used, it is possible to reduce the difference between the chromaticity in the oblique directions and the chromaticity in the front direction. However, since the substantial opening ratio for extracting emitted light decreases, the light extraction efficiency lowers as compared to a state before the adjustment of color filter sizes, and power consumption necessary for obtaining the same brightness increases.

SUMMARY OF THE INVENTION

One of aspects of the present invention provides a display device including a display region in which a plurality of pixels are arranged, wherein the plurality of pixels include a first pixel arranged in a central portion of the display region, and a second pixel arranged between the first pixel and an edge of the display region, each of the plurality of pixels includes a first light emitting element and a second light emitting element, and a color filter layer made of a color filter material is arranged on the first light emitting element and the second light emitting element, the first light emitting element includes a first color filter arranged in the color filter layer, and an opening of the first light emitting element is defined by the color filter layer, the second light emitting element includes a second color filter arranged in the color filter layer and having a spectral transmittance characteristic different from the first color filter, and a ratio of a size of the opening to a size of a light emitting region of the first light emitting element is smaller in the second pixel than in the first pixel.

BRIEF DESCRIPTION OF THE DRAWINGS

FIG. 1 is a view showing a first pixel and a second pixel in the display region of a display device;

FIGS. 2A to 2C are views showing the relationship between the exit angle and the chromaticity of light from a light emitting region;

FIGS. 14A and 14B are views each showing a display device as an electronic device according to the embodiment.

DESCRIPTION OF THE EMBODIMENTS

Figure 3:
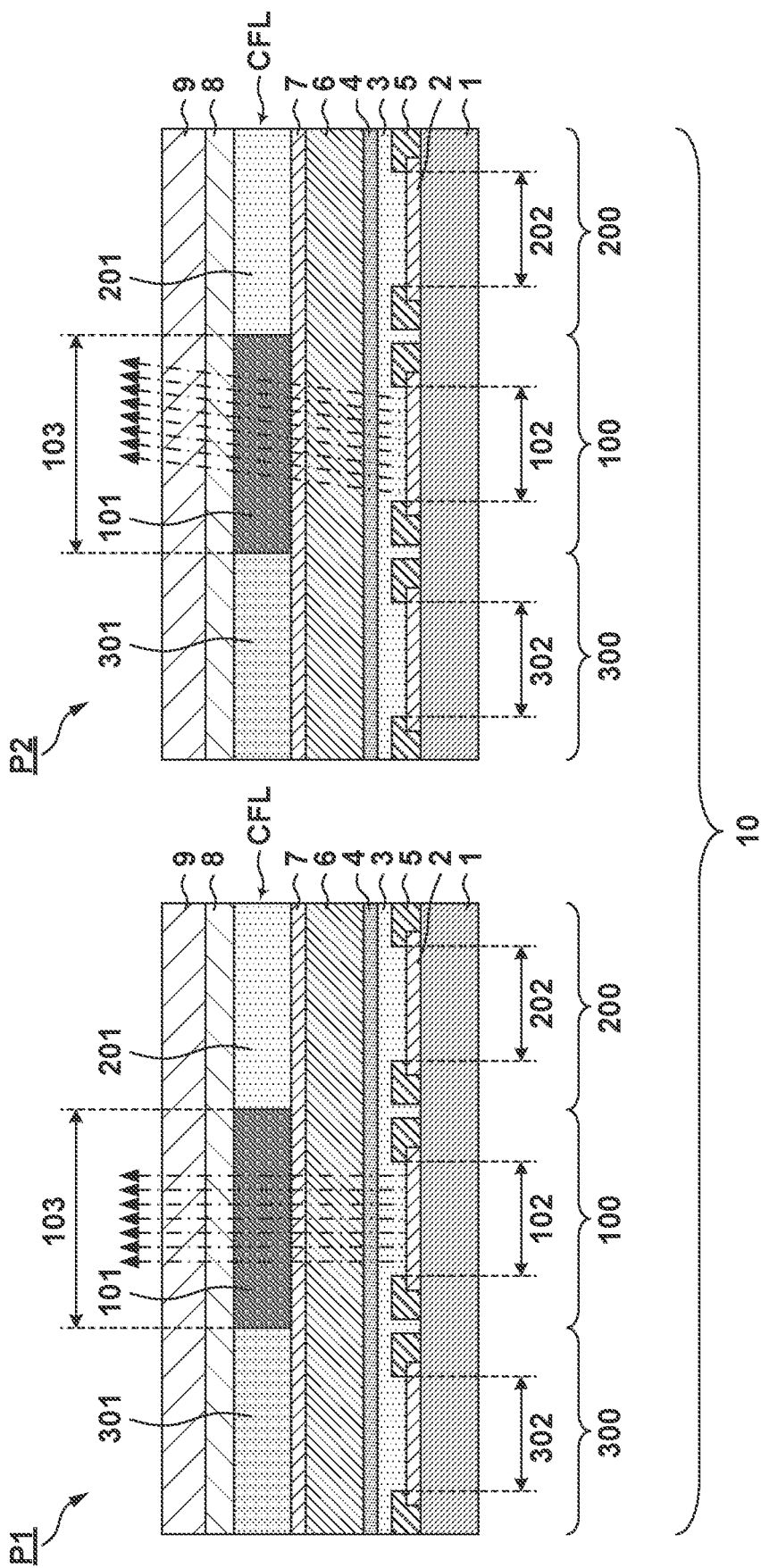
FIG. 3 is a sectional view schematically showing the first comparative example.

Hereinafter, embodiments will be described in detail with reference to the accompanying drawings. It should be noted that the following embodiments are not intended to limit the scope of the appended claims. A plurality of features are described in the embodiments, and not all the plurality of features are necessarily essential to the present invention. Also, the plurality of features may arbitrarily be combined. In addition, the same reference numerals denote the same or similar parts throughout the accompanying drawings, and a repetitive description will be omitted.

FIG. 1 schematically shows a plan view (planar view) of a display region DA of an organic EL display device 10 according to this embodiment. A plurality of pixels (main pixels) are arranged in the display region DA, and the plurality of pixels include a first pixel P1 and a second pixel P2. The first pixel P1 is a main pixel arranged in the central portion of the display region DA, and the second pixel P2 is a main pixel arranged between the first pixel P1 and an edge ED of the display region DA (for example, the peripheral portion). Each pixel (main pixel) includes a plurality of sub-pixels (organic EL light emitting elements). It can also be said that the first pixel P1 is included in a first region that is a main pixel portion, and the second pixel P2 is included in a second region surrounding the first region.

The relationship between the exit angle and the chromaticity of light from a light emitting region will be exemplarily described with reference to FIGS. 2A to 2C. FIG. 2A schematically shows white light that exits from a light emitting region ER of the first pixel P1 at an exit angle (θ)=0° (normal direction). FIG. 2B schematically shows white light that exits from the light emitting region ER of the second pixel P2 at an exit angle (θ)=400 (oblique direction). FIG. 2C shows a result of standardizing the peak intensity of a red component (from 580 nm to 780 nm) included in white light and the peak intensity of a blue component (from 400 nm to 490 nm) by the peak intensity of a green component (from 490 nm to 580 nm). As is apparent, the intensity ratio (to be referred to as the color component ratio hereinafter) of the red component, the green component, and the blue component is different between the normal direction and the oblique direction. This shows that a color is observed as colors different from each other, that is, the chromaticities are different from each other between a case in which the light emitting region ER is observed from an observation point in the normal direction and a case in which the light emitting region ER is observed from an observation point in the oblique direction. The chromaticity of light synthesized from transmitted light components (that is, a red component, a green component, and a blue component) generated from white light that has exited from the light emitting region ER and passed through red, green, and blue color filters is also different between the normal direction and the oblique direction. The example in FIG. 2C shows that if light observed in the normal direction is white light, the blue component is strong in light observed in the oblique direction.

A problem will be described below using the first comparative example and the second comparative example, and an embodiment for solving the problem will be described after that. FIG. 3 schematically shows the sectional structures of a first pixel (first main pixel) P1 and a second pixel (second main pixel) P2, which are arranged in a display region DA of an organic EL display device 10 according to the first comparative example. The first pixel P1 is a main pixel arranged in the central portion of the display region DA, and the second pixel P2 is a main pixel arranged between the first pixel P1 and an edge ED of the display region DA (for example, the peripheral portion). Each of the main pixels P1 and P2 can include, as three sub-pixels, a first organic EL light emitting element (to be referred to as a first light emitting element hereinafter) 100, a second organic EL light emitting element (to be referred to as a second light emitting element hereinafter) 200, and a third organic EL light emitting element (to be referred to as a third light emitting element hereinafter) 300.

The first light emitting element 100 can include a lower electrode 2, an insulating layer 5, an organic compound layer 3, an upper electrode 4, a protective layer 6, a planarization layer 7, a first color filter 101, a filling layer 8, and a counter substrate 9. The second light emitting element 200 can include the lower electrode 2, the insulating layer 5, the organic compound layer 3, the upper electrode 4, the protective layer 6, the planarization layer 7, a second color filter 201, the filling layer 8, and the counter substrate 9. The third light emitting element 300 can include the lower electrode 2, the insulating layer 5, the organic compound layer 3, the upper electrode 4, the protective layer 6, the planarization layer 7, a third color filter 301, the filling layer 8, and the counter substrate 9. The upper electrode 4, the protective layer 6, the planarization layer 7, the filling layer 8, and the counter substrate 9 can be shared by the light emitting elements 100, 200, and 300 (or the plurality of main pixels). The first light emitting element 100 is a light emitting element for blue, and the first color filter 101 allows a blue component to pass through. The second light emitting element 200 is a light emitting element for red, and the second color filter 201 allows a red component to pass through. The third light emitting element 300 is a light emitting element for green, and the third color filter 301 allows a green component to pass through. The color filters 101, 201, and 301 are color filters whose spectral transmittance characteristics are different from each other.

In FIG. 3, only light that exits from the first light emitting element 100 is indicated by dotted arrows for the sake of convenience. In the organic EL display device 10 according to the first comparative example, a light shielding region is not provided. Hence, the color component ratio between blue, red, and green light components after passing through the blue, red, and green color filters 101, 201, and 301 maintains the color component ratio in the white light before passing through the color filters 101, 201, and 301. For example, assume that white light before passing through the color filters 101, 201, and 301 has the characteristic shown in FIG. 2C, and light synthesized from red, green, and blue light components that exit from the first pixel P1 in the normal direction and pass through the color filters 101, 201, and 301 is white light. In this case, light synthesized from red, green, and blue light components that exit from the second pixel P2 in the oblique direction and pass through the color filters 101, 201, and 301 is light containing a strong blue component.

Figure 4:
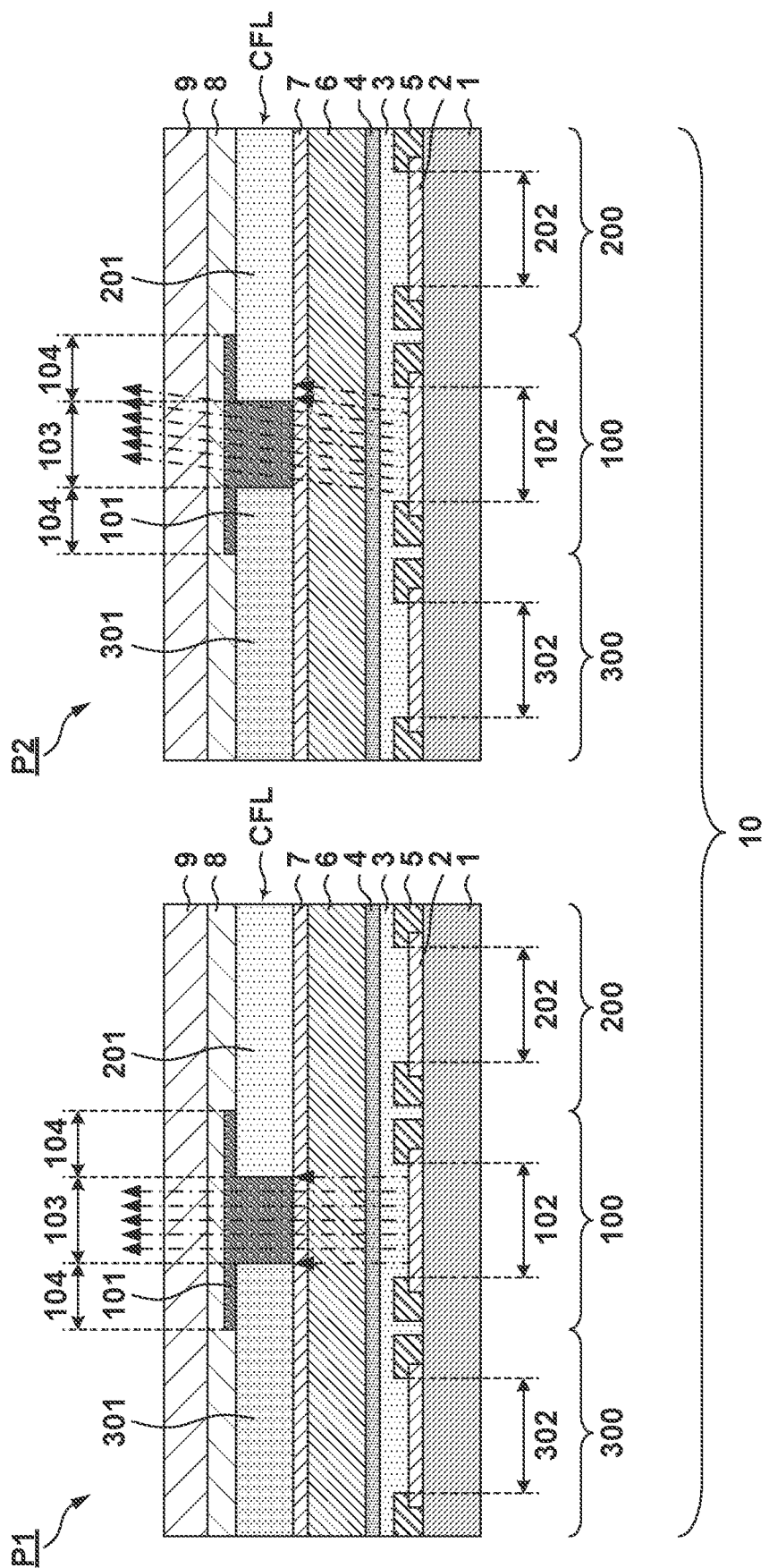
FIG. 4 is a sectional view schematically showing the second comparative example.

FIG. 4 schematically shows the sectional structures of a first pixel (first main pixel) P1 and a second pixel (second main pixel) P2, which are arranged in a display region DA of an organic EL display device 10 according to the second comparative example. The second comparative example has an arrangement formed by adding a light shielding region 104 to the first comparative example. The light shielding region 104 defines an opening 103 of a first light emitting element 100 for blue. In other words, the light shielding region 104 limits the amount of light that has exited from the first light emitting element 100 for blue that is allowed to pass through. The first pixel P1 and the second pixel P2 have the same arrangement. That is, the light shielding region 104 has the same size in the first pixel P1 and the second pixel P2. The light shielding region 104 is formed by the overlap of a first color filter 101 and a second color filter 201. Also, the light shielding region 104 is formed by the overlap of the first color filter 101 and a third color filter 301.

In this specification, the size may be, for example, a one-dimensional size or a two-dimensional size (for example, an area). Also, in this specification, an opening of a light emitting element means a portion that functions to define the amount of light that has exited from the light emitting region of the light emitting element that is allowed to pass through. An opening of a light emitting element can be a region where the color filter and the light shielding region provided in the light emitting element do not overlap in a planar view.

Figure 5:
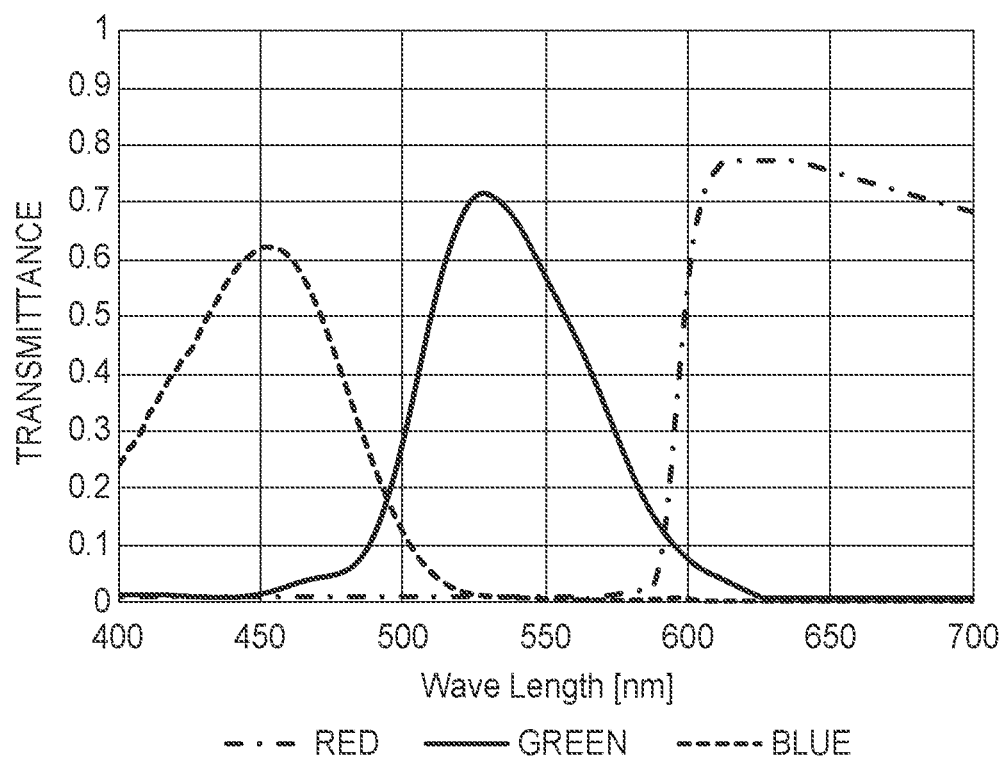
FIG. 5 is a graph showing the spectral transmittance characteristics of red, green, and blue color filters.

FIG. 5 shows the spectral transmittance characteristics of the color filters 101, 201, and 301. The first color filter 101 is a blue color filter, that is, a color filter configured to allow a blue component to pass through. The second color filter 201 is a red color filter, that is, a color filter configured to allow a red component to pass through. The third color filter 301 is a green color filter, that is, a color filter configured to allow a green component to pass through. As can be seen from FIG. 5, a light shielding characteristic (an attenuation characteristic by light absorption) can be obtained by the overlap of the first color filter 101 and the second color filter 201. Also, as can be seen from FIG. 5, a light shielding characteristic (an attenuation characteristic by light absorption) can be obtained by the overlap of the first color filter 101 and the third color filter 301.

In the second comparative example, the blue component in the light that exits in the oblique direction from the first light emitting element 100 for blue in the second pixel P2 can be reduced by providing the light shielding region 104. However, in the second comparative example, since the light shielding region 104 of the first pixel P1 and that of the second pixel P2 have the same arrangement, the blue component in the light that exits in the normal direction from the first light emitting element 100 for blue in the first pixel P1 is also reduced by the light shielding region 104. Hence, the efficiency of the first light emitting element 100 of the first pixel P1 arranged in the central portion lowers. This means that power consumption necessary for obtaining a desired brightness increases.

Figure 6:
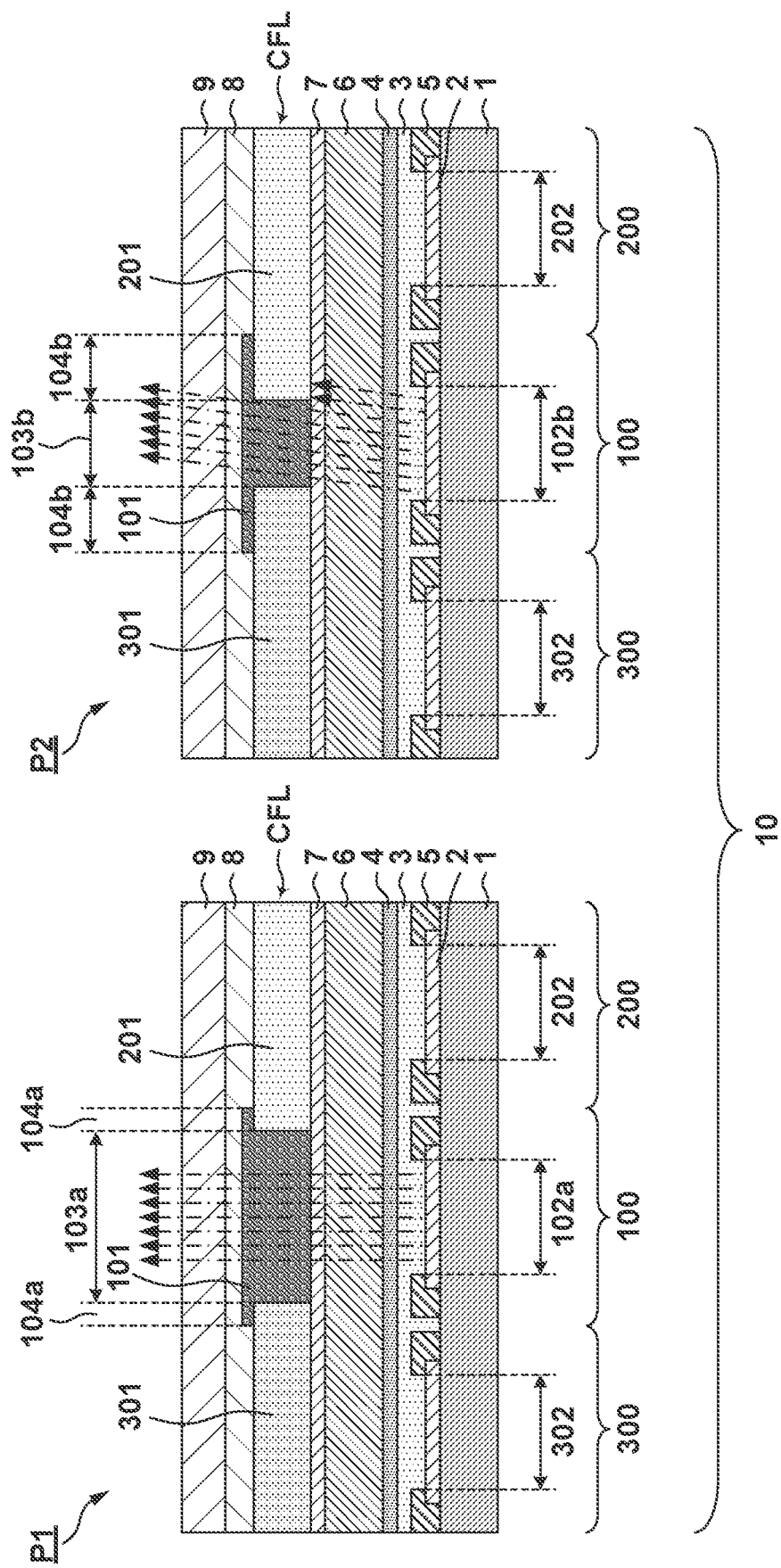
FIG. 6 is a sectional view schematically showing the sectional structures of a first pixel and a second pixel arranged in the display region of a display device according to an embodiment.
Figure 7:
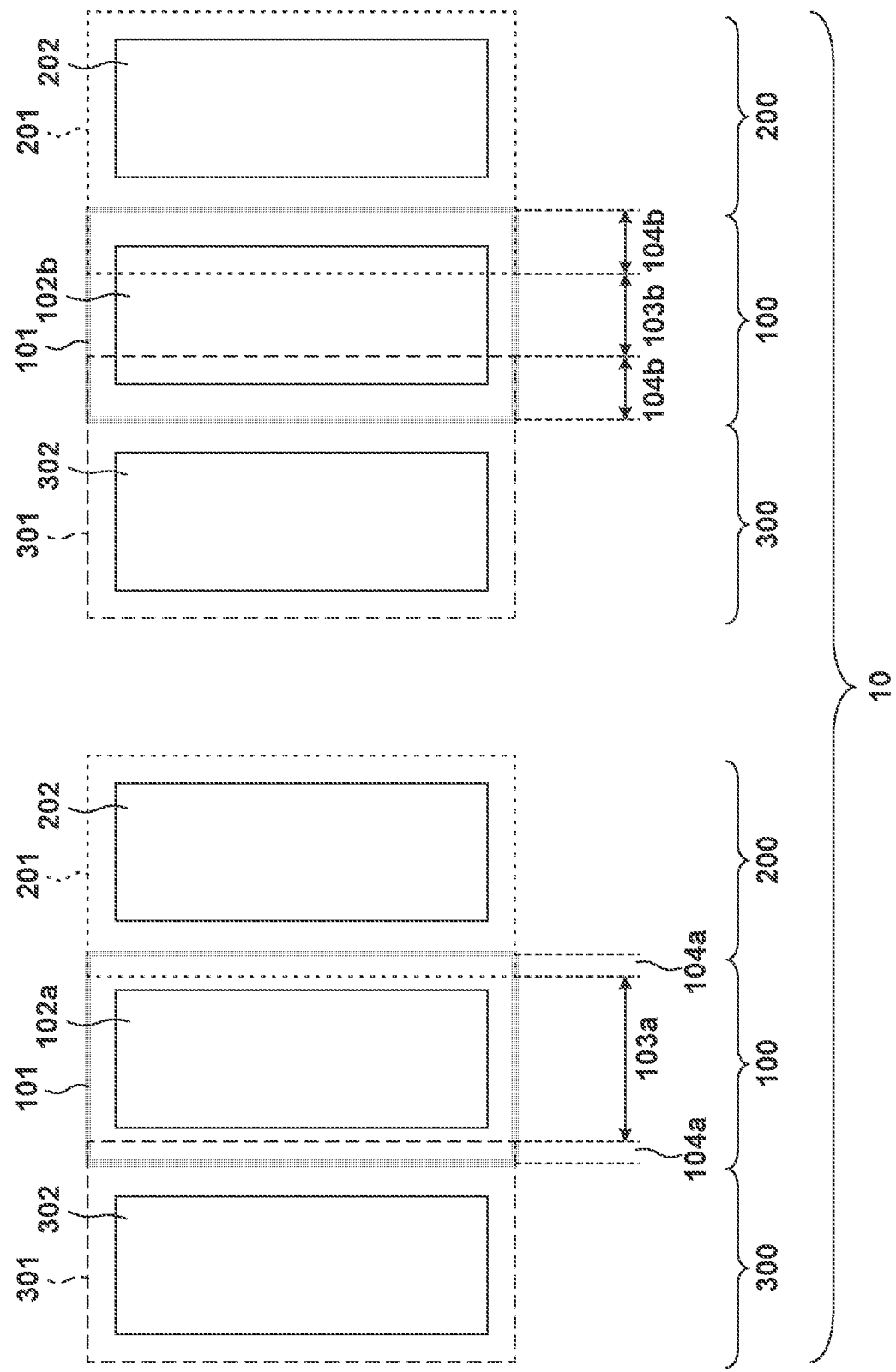
FIG. 7 is a view schematically showing the planar structures of the first pixel and the second pixel arranged in the display region of the display device according to the embodiment.

The organic EL display device 10 according to the embodiment will be described below. FIGS. 6 and 7 schematically show the sectional structures and the planar structures of the first pixel (first main pixel) P1 and the second pixel (second main pixel) P2, which are arranged in the display region DA of the organic EL display device 10 according to the embodiment. The first pixel P1 is a main pixel arranged in the central portion of the display region DA, and the second pixel P2 is a main pixel arranged between the first pixel P1 and the edge ED of the display region DA (for example, the peripheral portion). Each of the main pixels P1 and P2 can include, as three sub-pixels, a first light emitting element 100, a second light emitting element 200, and a third light emitting element 300. A color filter layer CFL made of a color filter material is arranged on the first light emitting element 100, the second light emitting element 200, and the third light emitting element 300.

The first light emitting element 100 can include a lower electrode 2 arranged on a substrate 1, an insulating layer 5, an organic compound layer 3, an upper electrode 4, a protective layer 6, a planarization layer 7, a first color filter 101, a filling layer 8, and a counter substrate 9. The second light emitting element 200 can include the lower electrode 2 arranged on the substrate 1, the insulating layer 5, the organic compound layer 3, the upper electrode 4, the protective layer 6, the planarization layer 7, a second color filter 201, the filling layer 8, and the counter substrate 9. The third light emitting element 300 can include the lower electrode 2 arranged on the substrate 1, the insulating layer 5, the organic compound layer 3, the upper electrode 4, the protective layer 6, the planarization layer 7, a third color filter 301, the filling layer 8, and the counter substrate 9. The upper electrode 4, the protective layer 6, the planarization layer 7, the filling layer 8, and the counter substrate 9 can be shared by the light emitting elements 100, 200, and 300 (or the plurality of main pixels).

The first light emitting element 100 includes a first light emitting region 102. Here, the first light emitting region 102 of the first light emitting element 100 of the first pixel P1 will be defined as a first light emitting region 102a, the first light emitting region 102 of the first light emitting element 100 of the second pixel P2 will be defined as a first light emitting region 102b, and these will be described discriminately as needed. The first light emitting region 102 can be a region formed by projecting the region where the first light emitting element 100 emits light onto the upper surface of the substrate 1. The second light emitting element 200 includes a second light emitting region 202. The second light emitting region 202 can be a region formed by projecting the region where the second light emitting element 200 emits light onto the upper surface of the substrate 1. The third light emitting element 300 includes a third light emitting region 302. The third light emitting region 302 can be a region formed by projecting the region where the third light emitting element 300 emits light onto the upper surface of the substrate 1.

The first color filter 101, the second color filter 201, and the third color filter 301 are arranged in the color filter layer CFL. In another viewpoint, the first color filter 101, the second color filter 201, and the third color filter 301 constitute the color filter layer CFL. The color filter layer CFL can be configured not to include a reflective film such as a metal film. In addition, the color filter layer CFL can be configured not to contact a reflective film such as a metal film. Since such a reflective film can cause a shift of chromaticity, it is not preferable to arrange the reflective film in the color filter layer CFL or in contact with the color filter layer CFL.

The first light emitting element 100 is a light emitting element for blue, and the first color filter 101 allows a blue component to pass through. The second light emitting element 200 is a light emitting element for red, and the second color filter 201 allows a red component to pass through. The third light emitting element 300 is a light emitting element for green, and the third color filter 301 allows a green component to pass through. The color filters 101, 201, and 301 are color filters whose spectral transmittance characteristics are different from each other and, for example, can have spectral transmittances as shown in FIG. 5.

In this embodiment, the first pixel P1 can include a first light shielding region 104a, and the second pixel P2 can include a second light shielding region 104b. The first light shielding region 104a defines an opening 103a of the first light emitting element 100 of the first pixel P1, and the second light shielding region 104b defines an opening 103b of the first light emitting element 100 of the second pixel P2. The first light shielding region 104a can limit the amount of light that has exited from the first light emitting element 100 of the first pixel P1 that is allowed to pass through, and the second light shielding region 104b can limit the amount of light that has exited from the first light emitting element 100 of the second pixel P2 that is allowed to pass through. In the second pixel P2, the center of the first light emitting region 102b of the first light emitting element 100 and the center of the opening 103b may be shifted from each other in a planar view.

The first light shielding region 104a and the second light shielding region 104b can be defined such that the size of the first light shielding region 104a is smaller than the size of the second light shielding region 104b. Hence, the first pixel P1 and the second pixel P2 have arrangements different from each other. The first light shielding region 104a can be formed by the overlap of the first color filter 101 and the second color filter 201 in the first pixel P1 and the overlap of the first color filter 101 and the third color filter 301 in the first pixel P1. The second light shielding region 104b can be formed by the overlap of the first color filter 101 and the second color filter 201 in the second pixel P2 and the overlap of the first color filter 101 and the third color filter 301 in the second pixel P2.

In this embodiment, the ratio of the opening 103a or 103b to the size of the first light emitting region 102a or 102b is smaller in the second pixel P2 than in the first pixel P1. That is, the ratio of the size of the opening 103b of the second pixel P2 to the size of the first light emitting region 102b of the second pixel P2 is smaller than the ratio of the size of the opening 103a of the first pixel P1 to the size of the first light emitting region 102a of the first pixel P1. Note that the ratio of the size of the opening 103b of the second pixel P2 to the size of the first light emitting region 102b of the second pixel P2 is given by (the size of the opening 103b of the second pixel P2)/(the size of the first light emitting region 102b of the second pixel P2). In addition, the ratio of the size of the opening 103a of the first pixel P1 to the size of the first light emitting region 102a of the first pixel P1 is given by (the size of the opening 103a of the first pixel P1)/(the size of the first light emitting region 102a of the first pixel P1).

According to this embodiment, the blue component in the light that exits in the oblique direction from the first light emitting element 100 for blue in the second pixel P2 can be reduced by providing the light shielding region 104b in the second pixel P2, as in the second comparative example. Also, according to this embodiment, an arrangement in which the ratio of the opening 103a or 103b to the size of the first light emitting region 102a or 102b is smaller in the second pixel P2 than in the first pixel P1 is employed. This can suppress attenuation of light that exits in the normal direction from the first light emitting element 100 for blue in the first pixel P1. This makes it possible to suppress power consumption for obtaining a desired brightness as compared to the second comparative example. That is, according to this embodiment, it is possible to reduce the chromaticity difference between pixels and also reduce power consumption.

The arrangement in which the ratio of the size of the opening of the light emitting element to the size of the first light emitting region is smaller in the second pixel P2 than in the first pixel P1 can be implemented by making the size of the opening 103b of the second pixel P2 smaller than the size of the opening 103a of the first pixel P1. For example, the light shielding region 104b of the second pixel P2 can be made larger than the light shielding region 104a of the first pixel P1. Such an arrangement is shown in FIGS. 6 and 7. The difference between the size of the opening 103a of the first light emitting element 100 of the first pixel P1 and the size of the opening 103b of the first light emitting element 100 of the second pixel P2 can be made larger than the difference between the size of the first light emitting region 102a of the first pixel P1 and the size of the first light emitting region 102b of the second pixel P2. Alternatively, the size of the first light emitting region 102a of the first pixel P1 can be made equal to the size of the first light emitting region 102b of the second pixel P2.

Figure 8:
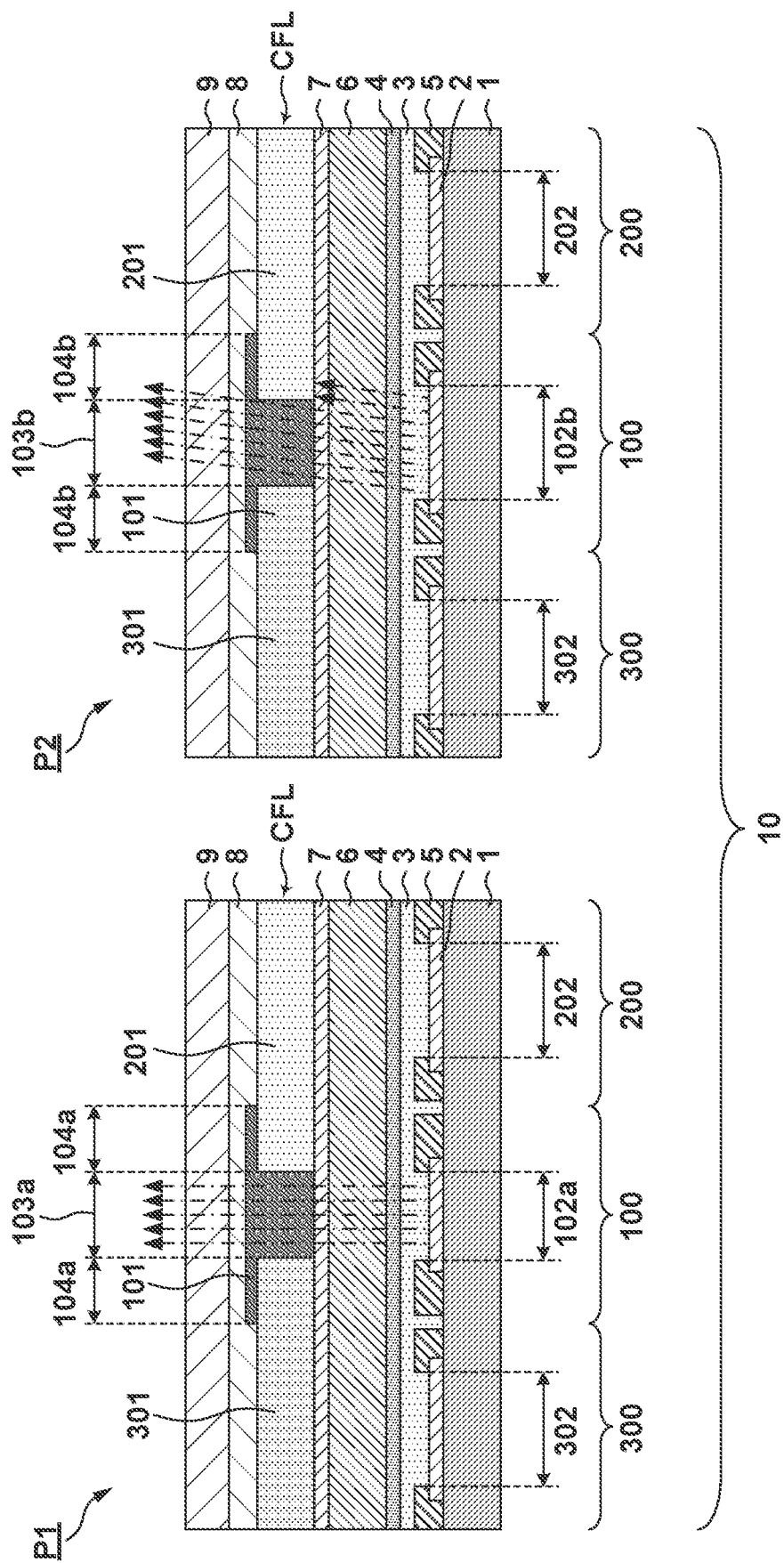
FIG. 8 is a sectional view schematically showing the sectional structures of a first pixel and a second pixel arranged in the display region of a display device according to another embodiment.
Figure 9:
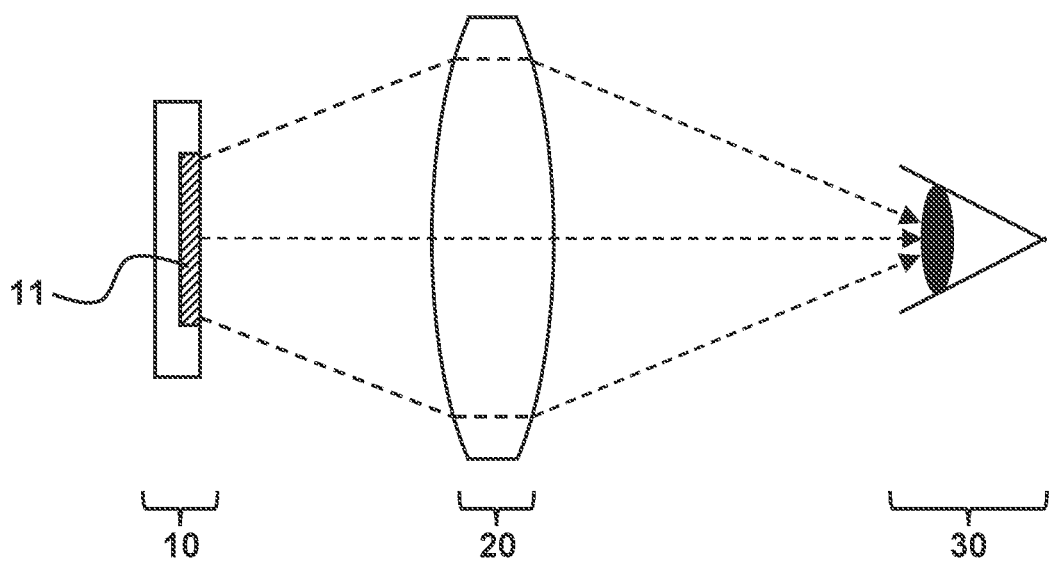
FIG. 9 is a view showing an example in which a display device is used together with a magnifying optical system.

The arrangement in which the ratio of the size of the opening of the light emitting element to the size of the first light emitting region is smaller in the second pixel P2 than in the first pixel P1 may be implemented by an arrangement in which the size of the light emitting region 102b of the first light emitting element of the second pixel P2 is larger than the size of the light emitting region 102a of the first light emitting element of the first pixel P1. Such an arrangement is shown in FIG. 8. The difference between the size of the light emitting region 102b of the first light emitting element 100 of the second pixel P2 and the size of the light emitting region 102a of the first light emitting element 100 of the first pixel P1 can be made larger than the difference between the size of the opening 103a of the first pixel P1 and the size of the opening 103b of the second pixel P2. Alternatively, the size of the opening 103a of the first pixel P1 can be made equal to the size of the opening 103b of the second pixel P2.

In the above embodiment, an example in which the light shielding regions 104a and 104b are formed by the overlap of color filters having spectral transmittance characteristics different from each other has been described. However, this is merely an embodiment, and the light shielding regions 104a and 104b may be formed by the overlap of the color filter 101 and a light absorbing material such as a black matrix. The light absorbing material can be a material that absorbs at least a blue component.

In the above embodiment, suppressing a blue component in an oblique direction has mainly been described. However, the present invention is not limited to this, and the arrangement of a pixel may be adjusted based on the above description in accordance with the position of the pixel in the display region to suppress other frequency components.

The above embodiment has been described by exemplifying two types of pixels, that is, the first pixel and the second pixel. However, more types of pixels can be provided. For example, the structure of each pixel can be adjusted such that the above-described ratio changes gradually or stepwise from the central portion of the display region to the edge.

In the above embodiment, one pixel (main pixel) is formed by three sub-pixels. However, the number of sub-pixels that form one pixel can be changed in accordance with a target color reproduction range. One pixel can be formed by at least two sub-pixels. One pixel may be formed by four sub-pixels. In this case, the four sub-pixels can be sub-pixels of a red component, a green component, a blue component, and a white component. One pixel may be formed by five or more sub-pixels.

The arrangement of the sub-pixels in each pixel (main pixel) is not limited to a specific form, and, for example, a stripe structure, a delta arrangement, or a Bayer arrangement is preferable. FIG. 7 shows the plan view of a stripe structure.

The difference of the color component ratio between the normal direction and the oblique direction has been described with reference to FIG. 2. A wavelength that does not easily lower the light intensity in the oblique direction than in the normal direction is a wavelength that increases the light emission intensity particularly by the optical distance from the light emitting layer to the lower electrode and the phase shift in the lower electrode. Hence, the transmittance peak wavelength of the first color filter preferably falls within the wavelength range of X given by the following inequality. Also, the PL spectrum peak of the light emitting material contained in the light emitting layer also preferably falls within the wavelength range of X given by the following inequality.

$$2L/(m-\phi/2\pi)\times 0.85 \leq \lambda \leq 2L/(m-\phi/2\pi)\times 1.15$$

where m is an integer of 0 or more, $\phi$ is the phase shift in the lower electrode, $\lambda$ is the wavelength, and L is the optical distance from the light emitting layer to the lower electrode.

In addition, the wavelength that increases the light emission intensity particularly by the optical distance from the light emitting layer to the lower electrode and the phase shift in the lower electrode and the transmittance peak wavelength of the first color filter are preferably blue components. The blue component is advantageous in extending the color reproduction range, and the transmittance peak wavelength of the first color filter preferably falls within the range of 400 nm to 490 nm. That is, the first color filter is preferably a blue color filter.

An arrangement may be employed in which in the central portion of the display region, the center of the first light emitting region and the center of the opening of the first color filter match in a planar view, and in the peripheral portion, the center of the first light emitting region and the center of the opening of the first color filter does not match in a planar view.

Detailed examples of the constituent elements of the organic EL display device 10 according to this embodiment will be described below.

The material of the substrate 1 is not limited if it can support the lower electrode 2, the organic compound layer 3, the upper electrode 4, and the like. As the material of the substrate 1, for example, quartz, glass, plastic, silicon, a resin, a metal, or the like is preferable. A switching element such as a transistor, a wiring, an interlayer dielectric film (not shown), and the like can be formed on the substrate 1.

The lower electrodes 2 of the first light emitting element 100, the second light emitting element 200, and the third light emitting element 300 are electrically insulated from each other. From the viewpoint of light emission efficiency, the lower electrode 2 can be made of a metal material with a visible light reflectance of 50% or more. More specifically, the lower electrode 2 can be made of a metal such as Al or Ag or an alloy obtained by adding Si, Cu, Ni, Nd, Ti, or the like to those. The lower electrode 2 may have a barrier layer on the surface on the light exit side. Examples of the material of the barrier layer are metals such as Ti, W, Mo, and Au and alloys thereof, and transparent conductive oxides such as ITO and IZO. To optimize optical interference, the transparent conductive oxide may have film thicknesses different from each other between the first light emitting element 100, the second light emitting element 200, and the third light emitting element 300.

The organic compound layer 3 can be arranged across all or some pixels arranged in the display region DA, that is, arranged commonly to those. Focusing on each pixel, the organic compound layer 3 can be arranged across the first light emitting element 100, the second light emitting element 200, and the third light emitting element 300, that is, arranged commonly to those. The organic compound layer 3 can be formed by, for example, a known technique such as vapor deposition or spin coating. The organic compound layer 3 can be arranged continuously over all of the display region DA. Focusing on each pixel, the organic compound layer 3 can be arranged continuously in the region where the first light emitting element 100, the second light emitting element 200, and the third light emitting element 300 are arranged.

The organic compound layer 3 is a layer including at least the light emitting layer and may be formed by a plurality of layers. Examples of the plurality of layers are a hole injection layer, a hole transport layer, an electron block layer, a light emitting layer, a hole block layer, an electron transport layer, and an electron injection layer. These layers are not limited to layers made of only organic compounds and may contain inorganic compounds. Since main light emission occurs in the organic compound, the element can be called an organic EL element.

In the organic compound layer 3, holes injected from an anode and electrons injected from a cathode recombine in the light emitting layer, and white light is emitted from the light emitting layer. The light emitting layer may be formed by a plurality of layers. The layers can contain a red light emitting material, a green light emitting material, and a blue light emitting material, and the emission colors are mixed, thereby obtaining white light. In addition, the light emitting layers may contain light emitting materials that emit light components having a complimentary color relationship, such as a blue light emitting material and a yellow light emitting material.

An electron injection layer (not shown) may be arranged between the organic compound layer 3 and the upper electrode 4. The electron injection layer can be made of a compound with a high electron donating property. The compound with a high electron donating property can include, for example, metals with a high electron donating property such as alkali metals such as lithium and cesium and alkali earth metals such as calcium and barium, and compounds thereof. The compound with a high electron donating property may be an organometallic complex formed by combining such a metal and an organic compound. These materials may form a single layer or a mixed layer with an organic compound in an electron transport layer.

The upper electrode 4 can be arranged across all or some pixels arranged in the display region DA, that is, arranged commonly to those. Focusing on each pixel, the upper electrode 4 can be arranged across the first light emitting element 100, the second light emitting element 200, and the third light emitting element 300, that is, arranged commonly to those. The upper electrode 4 has a light transmission property. The upper electrode 4 may be made of a semi-transmitting material having a characteristic of allowing a part of light that has reached the surface to pass through and reflecting the remaining part of the light (that is, a transflective property). The upper electrode 4 can be made of a transparent material such as a transparent conductive oxide, a single metal such as aluminum, silver, or gold, an alkali metal such as lithium or cesium, an alkali earth metal such as magnesium, calcium, or barium, or a semi-transmitting material made of an alloy material containing these metal materials. The semi-transmitting material can be an alloy containing magnesium or silver as a main component in particular. The upper electrode 4 may have a stacked structure of the above-described materials if it has a preferable transmittance. In an example, the lower electrode 2 can be an anode, and the upper electrode 4 can be a cathode. In another example, the lower electrode 2 can be a cathode, and the upper electrode 4 can be an anode.

The insulating layers 5 can be arranged between the lower electrodes 2 of the first light emitting element 100, the second light emitting element 200, and the third light emitting element 300. The insulating layers 5 can be arranged to, for example, cover the end portions of the lower electrodes 2 of the first light emitting element 100, the second light emitting element 200, and the third light emitting element 300, and can each include an opening that exposes a region on the inner sides of the end portions of the lower electrode 2. The insulating layers 5 can define the light emitting regions of the first light emitting element 100, the second light emitting element 200, and the third light emitting element 300. If the insulating layers 5 are not provided, the first light emitting region 102, the second light emitting region 202, and the third light emitting region 302 can be defined by the shape of the lower electrodes 2 themselves. The insulating layer 5 can be made of an inorganic material such as silicon nitride (SiN), silicon oxynitride (SiON), or silicon oxide (SiO). The insulating layer 5 can be formed using a known technique such as sputtering or chemical vapor deposition (CVD). The insulating layer 5 may be made of an organic material such as an acrylic resin or a polyimide resin.

The organic EL display device 10 may include the protective layer 6. The protective layer 6 can be arranged to cover the first light emitting element 100, the second light emitting element 200, and the third light emitting element 300. The protective layer 6 preferably contains an inorganic material having a light transmission property and having a very low permeability for oxygen and water from the outside. The protective layer 6 is preferably made of particularly silicon nitride (SiN), silicon oxynitride (SiON), silicon oxide (SiOx), aluminum oxide ($Al_2O_3$), titanium oxide ($TiO_2$), or the like. The protective layer 6 can be formed by sputtering, chemical vapor deposition (CVD), or atomic layer deposition (ALD). The protective layer 6 can have any form of a single layer and a stacked layer of the above-described materials if it has sufficient water blocking performance, or may have a stacked structure of the above-described inorganic materials and organic materials. As an organic material, a known organic compound (resin/polymer compound) can be applied. The protective layer 6 may have unevenness conforming to the shape of a structure formed before the protective layer 6. The protective layer 6 can also be called a sealing layer. Even if called a sealing layer, the protective layer 6 need not have perfect performance of sealing the organic EL display device 10.

The organic EL display device 10 may include the planarization layer 7 between the protective layer 6 and the color filter layer CFL. The planarization layer 7 is made of a material having a light transmission property, and the material can be either an inorganic material or an organic material. If the planarization layer 7 is made of a resin material, the uneven shape of the planarization layer 7 on the light exit side becomes smaller than that of the protective layer 6. Hence, scattered light generated by the unevenness of the protective layer 6 can be reduced. The planarization layer 7 can also be called a coat layer. The planarization layer 7 can be made of, for example, an organic material such as an acrylic resin, an epoxy resin, or a silicone resin. The planarization layer 7 can be formed by a known method such as coating or polymerization vapor deposition.

The color filter layer CFL may be formed directly on the protective layer 6 or the planarization layer 7, or a counter substrate on which the color filter layer CFL is formed may be bonded to the substrate on which the light emitting elements 100, 200, and 300 are formed. In the latter case, bonding can be performed while interposing a resin so no gap is formed between the color filter layer CFL and the light emitting elements 100, 200, and 300.

The first color filter 101, the second color filter 201, and the third color filter 301 can be formed by applying color resists to an underlayer such as the planarization layer 7 and patterning these by lithography. The color resist is made of, for example, a photocuring resin, and a pattern is formed by curing a portion irradiated with UV rays or the like.

The filling layer 8 may be arranged on the light exit side of the color filter layer CFL. The filling layer 8 has a light transmission property and is made of, for example, an organic material such as an acrylic resin, an epoxy resin, or a silicone resin. The surface of the filling layer 8 on the light exit side is preferably flat. In particular, if a counter substrate to be described later is not provided, the surface of the filling layer 8 on the light exit side is preferably flat. A planarization layer may be arranged between the color filter layer CFL and the filling layer 8. Such a planarization layer and the planarization layer 7 that can be arranged between the protective layer 6 and the color filter layer CFL can be made of the same material. The filling layer 8 and the planarization layer arranged between the color filter layer CFL and the filling layer 8 may contact outside the display region DA, that is, at an end portion of the display device 10. Making the planarization layer arranged between the color filter layer CFL and the filling layer 8 and the planarization layer 7 arranged between the protective layer 6 and the color filter layer CFL using the same material is advantageous because high adhesion can be obtained between these.

The counter substrate 9 can be arranged on the light exit side of the filling layer 8. The counter substrate 9 can be made of a material having a light transmission property. The counter substrate 9 is formed by, for example, a glass substrate, a plastic substrate, or the like, and the surface of the counter substrate 9 on the light exit side is preferably flat.

The organic EL display device 10 can be used as a constituent component of an electronic device. Such an electronic device includes, for example, an image capturing unit that captures an object, and an image display unit that displays an image based on an image signal generated based on data output from the image capturing unit, and the organic EL display device 10 can be used as the image display unit. The image capturing unit can include an image sensor such as a CMOS image sensor or a CCD image sensor. The image capturing unit can further include an optical system that forms an optical image of an object on the imaging plane of the image sensor.

Figure 10:
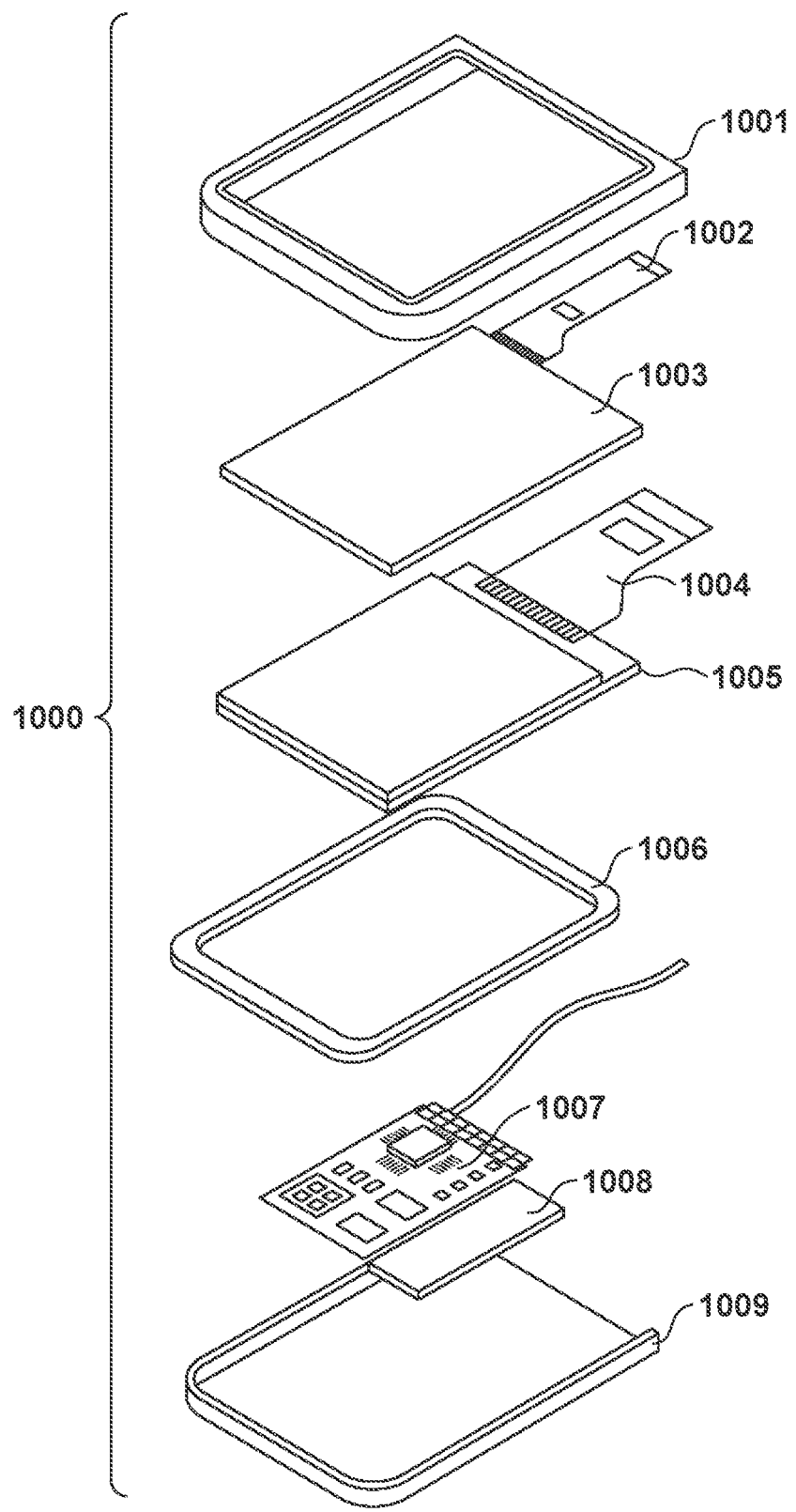
FIG. 10 is a view showing a display device as an electronic device according to the embodiment.

FIG. 10 is a schematic view showing an example of a display device as an electronic device according to the embodiment. A display device 1000 can include, between an upper cover 1001 and a lower cover 1009, a touch panel 1003, a display panel 1005, a frame 1006, a circuit board 1007, and a battery 1008. As the display panel 1005, the above-described organic EL display device 10 can be used. Flexible printed circuits FPC 1002 and 1004 are connected to the touch panel 1003 and the display panel 1005, respectively. Transistors are printed on the circuit board 1007. The battery 1008 may not be provided if the display device 1000 is not a portable apparatus, or may be provided at another position even if the display device 1000 is a portable apparatus.

The organic EL display device 10 may be used as the display unit of a portable terminal. At this time, the organic EL display device 10 may have both a display function and an operation function. Examples of the portable terminal are a mobile phone such as a smartphone, a tablet, and a head mounted display.

Figure 11A:
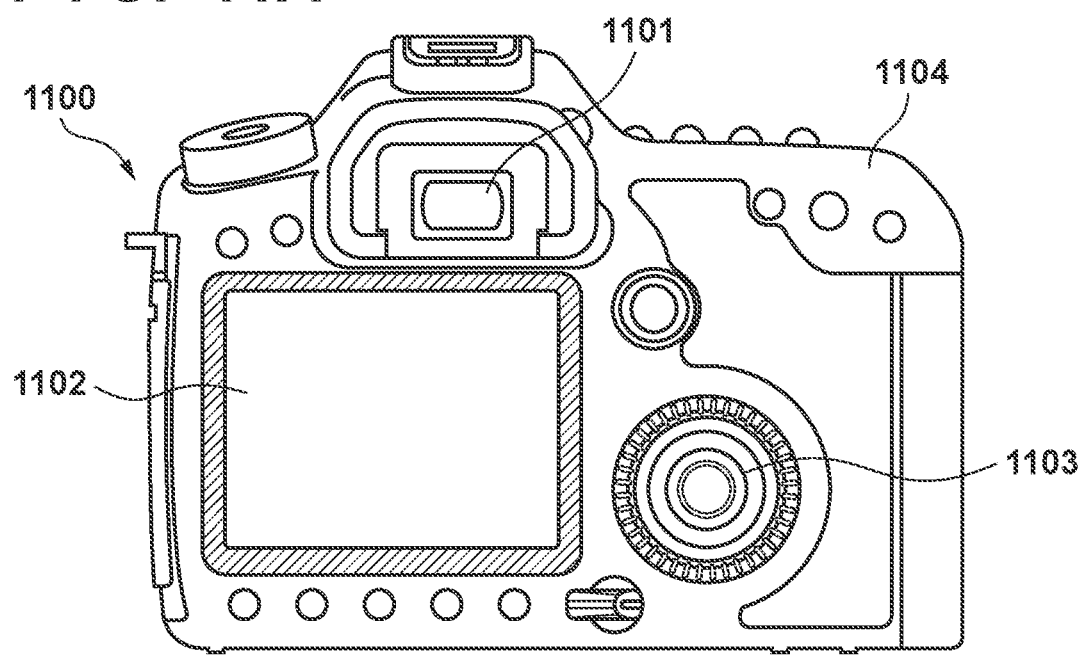
FIGS. 11A and 11B are views each showing a display device as an electronic device according to the embodiment.

FIG. 11A is a schematic view showing an example of an image capturing device as an electronic device according to the embodiment. An image capturing device 1100 can include a viewfinder 1101, a back display 1102, an operation unit 1103, and a housing 1104. The viewfinder 1101 can include the organic EL display device 10 as a display unit. In this case, the organic EL display device 10 may display not only a captured image but also environment information, an image capturing instruction, and the like. The environment information may include the intensity of external light, the direction of external light, the moving speed of an object, and the possibility that the object is shielded by a shielding object.

The image capturing device 1100 includes an optical unit (not shown). The optical unit includes a plurality of lenses, and forms an image on an image capturing element stored in the housing 1104. The plurality of lenses can adjust the focal point by adjusting their relative positions. This operation can be automatically performed. The image capturing device may be called a photoelectric conversion device. Instead of sequentially capturing an image, the photoelectric conversion device can include, as an image capturing method, a method of detecting the difference from a previous image, a method of extracting an image from an always recorded image, or the like.

Figure 11B:
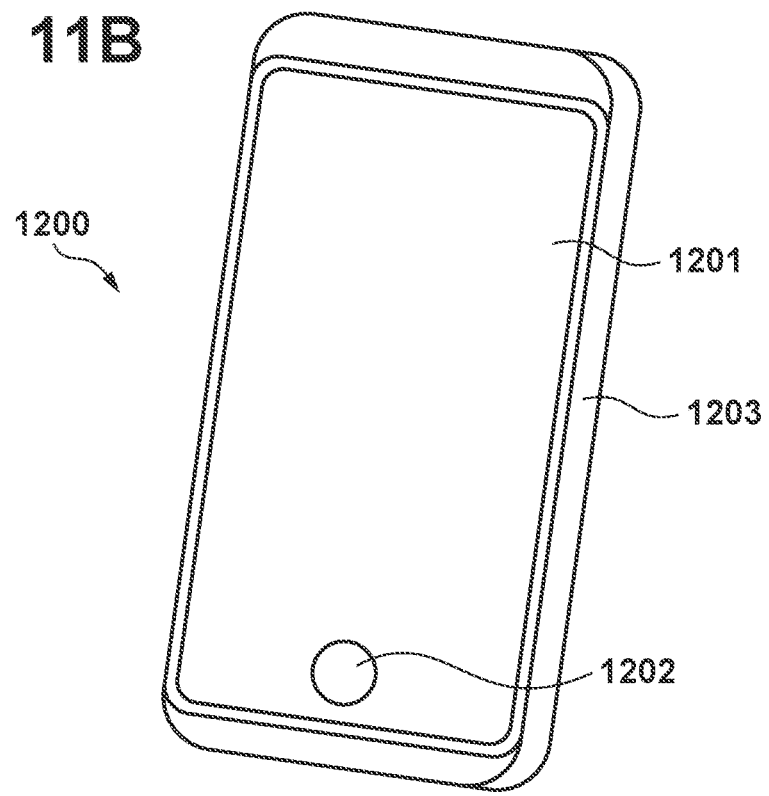

FIG. 11B is a schematic view showing an example of a portable terminal as an electronic device according to the embodiment. A portable terminal 1200 includes a display unit 1201, an operation unit 1202, and a housing 1203. The housing 1203 may store a circuit, a printed board including the circuit, a battery, and a communication unit. The operation unit 1202 may be a button, or a touch panel type reaction portion. The operation unit may be a biometric authentication unit that recognizes a fingerprint and performs unlock. The portable terminal including a communication unit can also be regarded as a communication apparatus. The portable terminal may further have a camera function by including a lens and an image capturing element. An image captured by the camera function is displayed on the display unit. Examples of the electronic apparatus are a smartphone and a notebook computer.

Figure 12A:
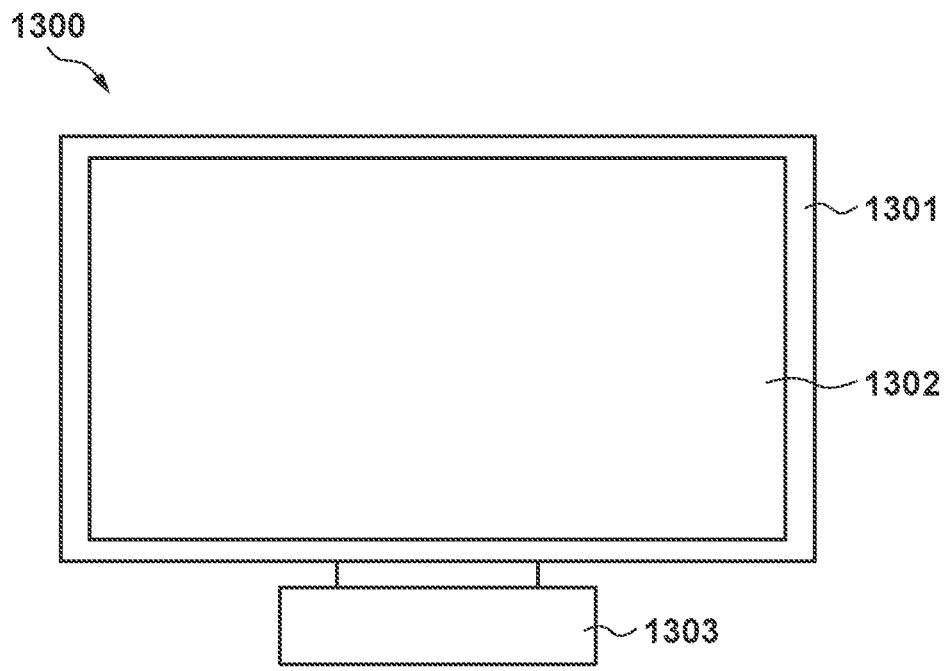
FIGS. 12A and 12B are views each showing a display device as an electronic device according to the embodiment.
Figure 12B:
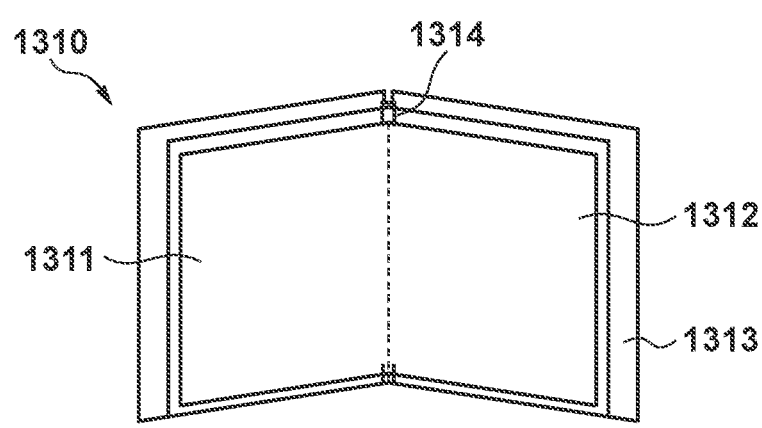

FIGS. 12A and 12B are schematic views showing examples of a display device as an electronic device according to the embodiment. FIG. 12A shows a display device usable as a TV monitor, a PC monitor, or the like. A display device 1300 includes a frame 1301 and a display unit 1302. As the display unit 1302, the organic EL display device 10 can be used. The display device shown in FIG. 12A can include a base 1303 that supports the frame 1301 and the display unit 1302. The base 1303 is not limited to the form shown in FIG. 12A, and the lower side of the frame 1301 may serve as the base. The frame 1301 and the display unit 1302 may form a curved surface, and the radius of curvature can be, for example, 5,000 mm (inclusive) to 6,000 mm (inclusive).

FIG. 12B is a schematic view showing another example of the display device as an electronic device according to the embodiment. A display device 1310 shown in FIG. 12B is configured to be foldable, and is a so-called foldable display device. The display device 1310 includes a first display unit 1311, a second display unit 1312, a housing 1313, and a bending point 1314. As the first display unit 1311 and the second display unit 1312, the organic EL display device 10 can be used. The first display unit 1311 and the second display unit 1312 may be one jointless display device. The first display unit 1311 and the second display unit 1312 can be separated at the bending point. The first display unit 1311 and the second display unit 1312 may display different images, or one image may be displayed by the first and second display units.

Figure 13A:
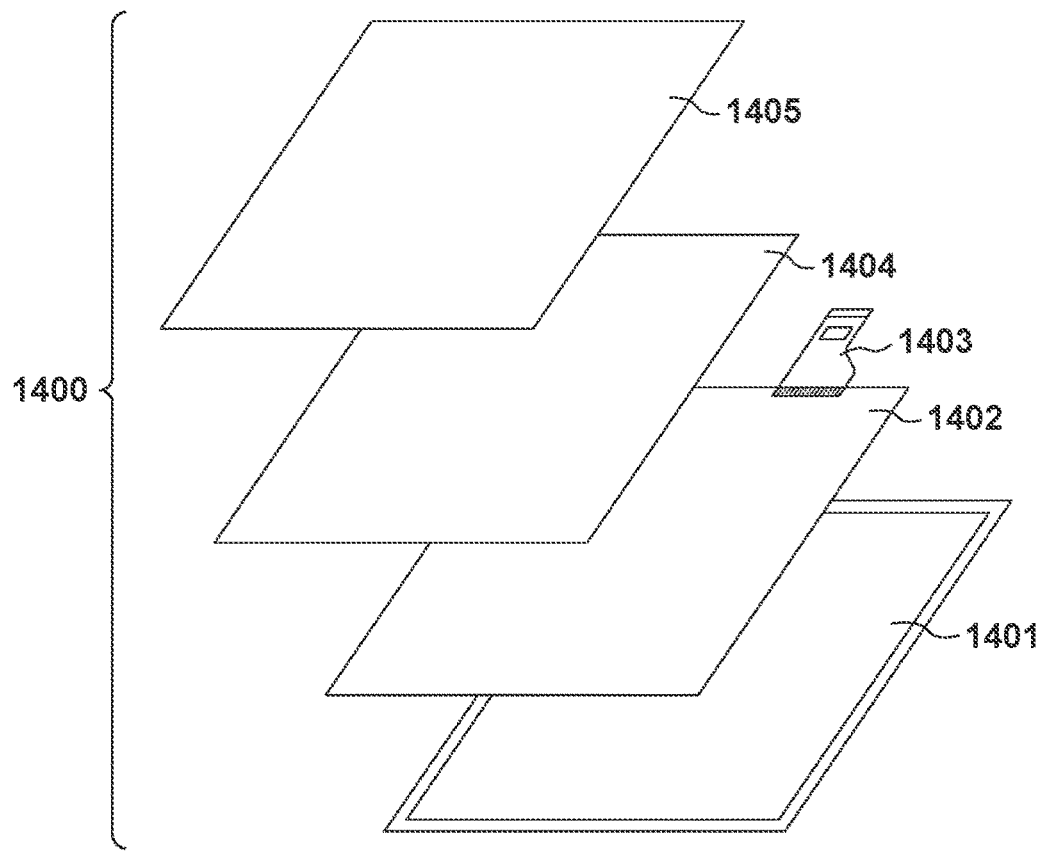
FIGS. 13A and 13B are views showing an illumination device and a moving body according to the embodiment, respectively.

FIG. 13A is a schematic view showing an example of an illumination device as an electronic device according to the embodiment. An illumination device 1400 may include a housing 1401, a light source 1402, a circuit board 1403, an optical filter 1404, and a light diffusing portion 1405. As the light source, the organic EL display device 10 can be used. The optical filter may be a filter that improves the color rendering property of the light source. The light diffusing portion can effectively diffuse light of the light source and send the light to a wide range in illumination or the like. The optical filter and the light diffusing portion may be provided on the light exit side of the illumination. A cover may be provided on the outermost portion, as needed.

The illumination device is, for example, a device that illuminates the inside of a room. The illumination device may emit any one of a white color, a daytime white color, and blue to red colors. A light control circuit that controls the light may be provided. The illumination device may include an organic light emitting element according to the present invention, and a power supply circuit connected to that. The power supply circuit is a circuit that converts an AC voltage into a DC voltage. A white color has a color temperature of 4,200 K, and the daytime white color has a color temperature of 5,000 K. The illumination device may include a color filter. The illumination device may include a heat dissipation unit. The heat dissipation unit dissipates heat to the outside of the device, and a metal with a high specific heat, a liquid silicone, or the like can be used.

Figure 13B:
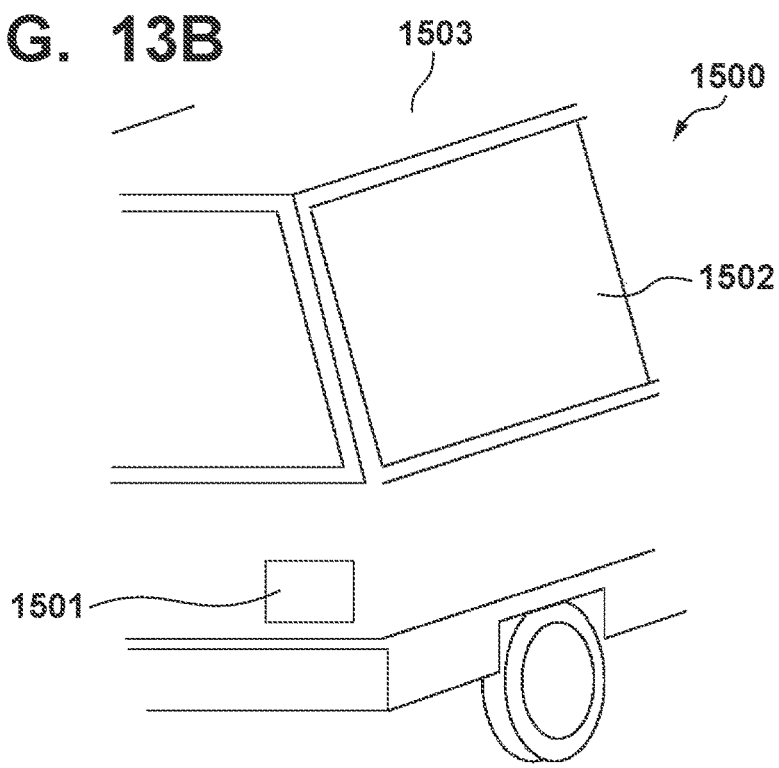

FIG. 13B is a schematic view of an automobile as an example of a moving body according to the embodiment. The automobile includes a tail lamp as an example of a lighting tool. An automobile 1500 includes a tail lamp 1501, and may have a form to turn on the tail lamp when performing a brake operation or the like. As the tail lamp 1501, the organic EL display device 10 can be used. The tail lamp may include a protective member that protects the organic EL element. The protective member has a strength to a certain extent. The protective member can be made of any material if it is transparent, and is preferably made of polycarbonate or the like. A furandicarboxylic acid derivative, an acrylonitrile derivative or the like may be mixed into polycarbonate.

The automobile 1500 may include a vehicle body 1503 and a window 1502 attached to that. If the window is not a window used to confirm the front and rear of the automobile, it may be a transparent display. As the transparent display, the organic EL display device 10 can be used. In this case, constituent materials such as electrodes provided in the organic EL display device 10 are formed by transparent members.

The moving body may be a ship, an airplane, a drone, or the like. The moving body may include an airframe, and a lighting tool provided on the airframe. The lighting tool may emit light to notify the position of the airframe. The lighting tool includes an organic light emitting element according to this embodiment.

Examples of the electronic device according to the embodiment will be described with reference to FIGS. 14A and 14B. The electronic device can be, for example, a wearable device such as smartglasses, an HMD, or a smart contact lens. As the display unit of such an electronic device, the organic EL display device 10 can be used.

FIG. 14A shows an example of glasses 1400 (smartglasses) as an electronic device. An image capturing device 1402 such as a CMOS sensor or an SPAD is provided on the surface side of a lens 1401 of the glasses 1400. In addition, a display unit is provided on the back surface side of the lens 1401. As the display unit, the organic EL display device 10 can be used.

The glasses 1400 can further include a control device 1403. The control device 1403 functions as a power supply that supplies power to the image capturing device 1402 and the display device according to each embodiment. In addition, the control device 1403 controls the operations of the image capturing device 1402 and the display device. An optical system configured to condense light to the image capturing device 1402 is formed on the lens 1401.

FIG. 14B shows another example of the glasses 1400 (smartglasses) as an electronic device. Glasses 1410 includes a control device 1412, and an image capturing device and a display device are mounted in the control device 1412. As the display device, the organic EL display device 10 can be used. The image capturing device in the control device 1412 and an optical system configured to project light emitted from the display device are formed in a lens 1411, and an image is projected to the lens 1411. The control device 1412 functions as a power supply that supplies power to the image capturing device and the display device, and controls the operations of the image capturing device and the display device. The control device 1412 may include a line-of-sight detection unit that detects the line of sight of a wearer. The detection of a line of sight may be done using infrared rays. An infrared ray emitting unit emits infrared rays to an eyeball of the user who is gazing at a displayed image. An image capturing unit including a light receiving element detects reflected light of the emitted infrared rays from the eyeball, thereby obtaining a captured image of the eyeball. A reduction means for reducing light from the infrared ray emitting unit to the display unit in a planar view is provided, thereby reducing deterioration of image quality.

The line of sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used. More specifically, line-of-sight detection processing based on pupil center corneal reflection is performed. Using pupil center corneal reflection, a line-of-sight vector representing the direction (rotation angle) of the eyeball is calculated based on the image of the pupil and the Purkinje image included in the captured image of the eyeball, thereby detecting the line-of-sight of the user.

The display device according to the embodiment may include an image capturing device including a light receiving element, and a displayed image may be controlled based on the line-of-sight information of the user from the image capturing device. More specifically, the display device can decide a first visual field region at which the user is gazing and a second visual field region other than the first visual field region based on the line-of-sight information. The first visual field region and the second visual field region may be decided by the control device of the display device, or those decided by an external control device may be received. In the display region of the display device, the display resolution of the first visual field region may be controlled to be higher than the display resolution of the second visual field region. That is, the resolution of the second visual field region may be lower than that of the first visual field region.

In addition, the display region includes a first display region and a second display region different from the first display region, and a region of higher priority is decided from the first display region and the second display region based on line-of-sight information. The first display region and the second display region may be decided by the control device of the display device, or those decided by an external control device may be received. The resolution of the region of higher priority may be controlled to be higher than the resolution of the region other than the region of higher priority. That is, the resolution of the region of relatively low priority may be low.

Note that AI may be used to decide the first visual field region or the region of higher priority. The AI may be a model configured to estimate the angle of the line of sight and the distance to a target ahead the line of sight from the image of the eyeball using the image of the eyeball and the direction of actual viewing of the eyeball in the image as supervised data. The AI program may be held by the display device, the image capturing device, or an external device. If the external device holds the AI program, it is transmitted to the display device via communication.

When performing display control based on line-of-sight detection, smartglasses further including an image capturing device configured to capture the outside can preferably be applied. The smartglasses can display captured outside information in real time.

As described above, when a device using the organic light emitting element according to this embodiment is used, stable display with high image quality can be performed even in long time display.

Several examples will be described below.

Example 1

A display device having the arrangement shown in FIG. 6 was produced in the following way. First, aluminum was formed on a substrate 1 and patterned, thereby forming a first light emitting element, a second light emitting element, and a third light emitting element. Next, insulating layers 5 were formed between lower electrodes 2. The insulating layers 5 were made of silicon oxide. The film thickness of the insulating layers 5 was 65 nm. An opening portion was formed in the insulating layer 5 of each light emitting element to form a first light emitting region, a second light emitting region, and a third light emitting region. The widths of the openings of the first light emitting regions, the second light emitting regions, and the third light emitting regions in the central portion and the peripheral portion of the display region were all 3.8 µm.

Next, an organic compound layer was formed on the lower electrodes 2. More specifically, following compound 1 was formed as a hole injection layer to a thickness of 3 nm. Next, following compound 2 was formed as a hole transport layer to a thickness of 15 nm, and following compound 3 was formed as an electron block layer to a thickness of 10 nm.

A first light emitting layer was formed to a thickness of 10 nm such that following compound 4 serving as a host material was contained in a weight ratio of 97%, and following compound 5 serving as a light emitting dopant was contained in a weight ratio of 3%. A second light emitting layer was formed to a thickness of 10 nm such that following compound 4 serving as a host material was contained in a weight ratio of 98%, and following compounds 6 and 7 serving as light emitting dopants were each contained in a weight ratio of 1%. As an electron transport layer, following compound 8 was formed to a thickness of 110 nm. As an electron injection layer, lithium fluoride was formed to a thickness of 1 nm.

Compound 1

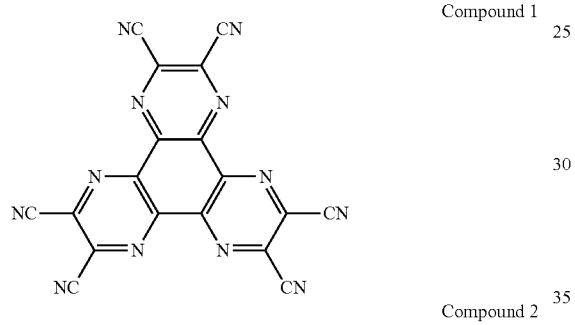

Compound 2

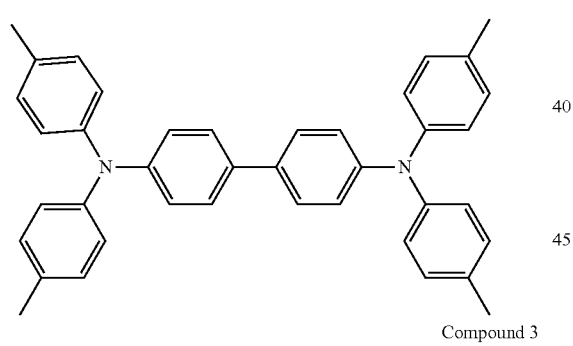

Compound 3

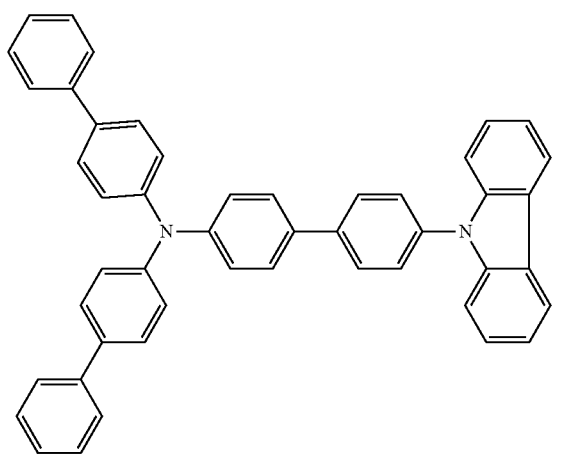

-continued

Compound 4

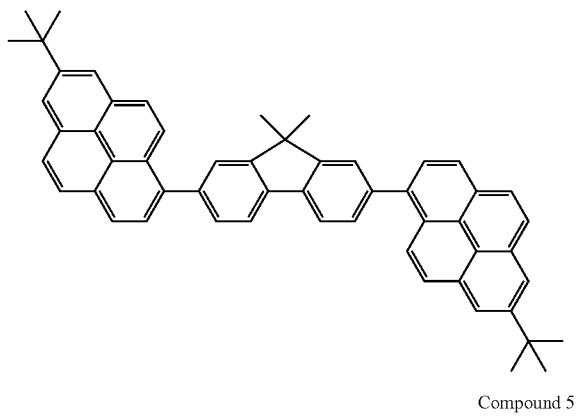

Compound 5

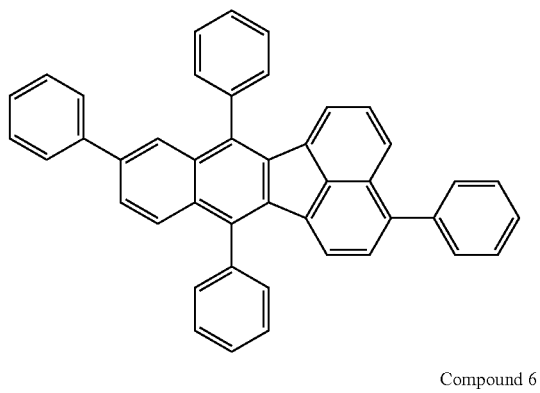

Compound 6

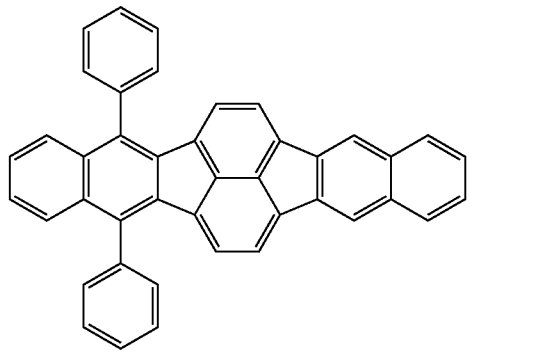

Compound 7

Compound 8

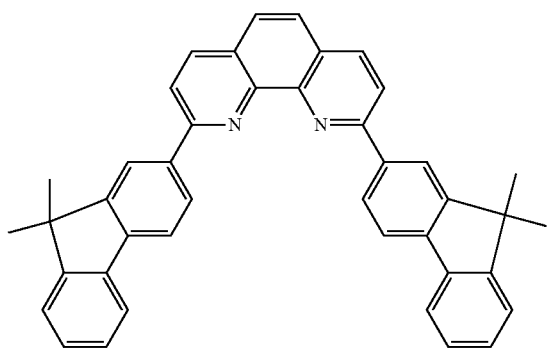

Next, as an upper electrode 4, an Mg/Ag alloy was formed to a thickness of 10 nm. The ratio of Mg and Ag was 1:1. After that, as a protective layer 6, an SiN film was formed to a thickness of 2 μm by CVD. Also, a planarization layer 7 was formed by spin coating to a thickness of 300 nm on the SiN film.

Next, a color filter layer CFL was formed on the planarization layer 7. A first color filter was a color filter configured to allow a blue component to pass through, a second color filter was a color filter configured to allow a red component to pass through, and a third color filter was a color filter configured to allow a green component to pass through.

In a first pixel in the central portion of the display region, as a first light shielding region, the first color filter and the second color filter were formed to overlap in a planar view, and the overlap amount was 0.1 μm. Also, as a first light shielding region, the first color filter and the third color filter were formed to overlap in a planar view, and the overlap amount was 0.1 μm. The size of the opening of the first color filter (the opening of the first light emitting element) in the first pixel in the central portion of the display region was 5.0 μm, and the ratio of the size of the opening of the first color filter to the size of the first light emitting region of the first pixel in the central portion was 1.32.

In a second pixel in the peripheral portion of the display region, as a first light shielding region, an end portion of the first color filter and an end portion of the second color filter were formed to overlap in a planar view, and the overlap amount was 0.4 μm. Also, as a first light shielding region, an end portion of the first color filter and an end portion of the third color filter were formed to overlap in a planar view, and the overlap amount was 0.4 μm.

The size of the opening of the first color filter (the opening of the first light emitting element) in the second pixel in the peripheral portion of the display region was 4.4 μm, and the ratio of the size of the opening of the first light shielding region to the size of the first light emitting region of the second pixel in the peripheral portion was 1.16.

As described above, in Example 1, a display device in which the ratio of the size of the opening of the first color filter (the opening of the first light emitting element) to the size of the light emitting region of the first light emitting element was smaller in the second pixel arranged in the peripheral portion than in the first pixel arranged in the central portion was produced. According to this arrangement, the effect of reducing the chromaticity difference between the pixels was confirmed. Also, according to this arrangement, it was confirmed that power consumption was reduced.

Example 2

In Example 2, a display device was produced in the same way as in Example 1 except color filters and first light shielding regions.

As a first light shielding region, a black resin material was formed on a planarization layer. The black resin material was formed on the side of the first light emitting element at each of the boundary between the first light emitting element and the second light emitting element and the boundary between the first light emitting element and the third light emitting element. In a first pixel in the central portion of the display region, the width (size) of the black resin material was 0.1 μm. Hence, in the first pixel in the central portion of the display region, the size of the opening of the first color filter formed later was set to 5.0 μm, and the ratio of the size of the opening of the first color filter (the opening of the first light emitting element) to the size of the first light emitting region was set to 1.32.

In a second pixel in the peripheral portion of the display region, the width (size) of the black resin material was 0.4 μm. Hence, in the second pixel in the peripheral portion of the display region, the size of the opening of the first color filter (the opening of the first light emitting element) formed later was set to 4.4 μm, and the ratio of the size of the opening of the first color filter to the size of the first light emitting region was set to 1.16.

A first color filter, a second color filter, and a third color filter were formed on the black resin material. In the central portion and the peripheral portion of the display region, the first color filter and the second color filter were formed to overlap in a planar view, and the overlap amount was 0.1 μm. Also, the first color filter and the third color filter were formed to overlap in a planar view, and the overlap amount was 0.1 μm.

As described above, in Example 2, a display device in which the ratio of the size of the opening of the first color filter (the opening of the first light emitting element) to the size of the light emitting region of the first light emitting element was smaller in the second pixel arranged in the peripheral portion than in the first pixel arranged in the central portion was produced. According to this arrangement, the effect of reducing the chromaticity difference between the pixels was confirmed. Also, according to this arrangement, it was confirmed that power consumption was reduced.

Example 3

In Example 3, a display device was produced in the same way as in Example 1 except first light emitting regions and first light shielding regions.

In a first pixel in the central portion of the display region, the opening width (size) of the first light emitting region was 3.5 μm. The opening widths of the second light emitting region and the third light emitting region in the central portion were all 3.8 μm. The opening widths of the first light emitting region, the second light emitting region and the third light emitting region in a second pixel in the peripheral portion of the display region were all 3.8 μm.

As for the color filters, in the central portion and the peripheral portion of the display region, the first color filter and the second color filter were formed to overlap in a planar view, and the overlap amount was 0.1 μm. Also, the first color filter and the third color filter were formed to overlap in a planar view, and the overlap amount was 0.1 μm. The size of the opening of the first color filter was 4.4 µm in the central portion and the peripheral portion of the display region.

In the first pixel in the central portion of the display region, the ratio of the size of the opening of the first color filter (the opening of the first light emitting element) to the size of the first light emitting region was 1.26. In the second pixel in the peripheral portion of the display region, the ratio of the size of the opening of the first color filter (the opening of the first light emitting element) to the size of the first light emitting region was 1.16.

As described above, in Example 3, a display device in which the ratio of the size of the opening of the first color filter (the opening of the first light emitting element) to the size of the light emitting region of the first light emitting element was smaller in the second pixel arranged in the peripheral portion than in the first pixel arranged in the central portion was produced. According to this arrangement, the effect of reducing the chromaticity difference between the pixels was confirmed. Also, according to this arrangement, it was confirmed that power consumption was reduced.

According to the present invention, a technique advantageous in reducing the chromaticity difference between pixels is provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions This application claims the benefit of Japanese Patent Application No. 2020-053143, filed Mar. 24, 2020 which is hereby incorporated by reference herein in its entirety.

What is claimed is:

1. A display device comprising a first pixel and a second pixel, each of the first pixel and the second pixel including a first light emitting element and a second light emitting element,
wherein the first light emitting element includes a first color filter,
wherein the second light emitting element includes a second color filter having a spectral transmittance characteristic different from the first color filter, and
wherein a first difference between a first area of an opening of the first color filter in the first pixel and a second area of an opening of the first color filter in the second pixel is different from a second difference between a third area of an opening of the second color filter in the first pixel and a fourth area of an opening of the second color filter in the second pixel.

2. The display device according to claim 1, wherein the first color filter is a blue filter,
wherein the second color filter is a green filter, and
wherein the first difference is larger than the second difference.

3. The display device according to claim 2, wherein the fourth area is smaller than the third area.

4. The display device according to claim 3, wherein the first area is the same as the second area.

5. The display device according to claim 2, wherein the second area is larger than the first area.

6. The display device according to claim 5, wherein the fourth area is the same as the third area.

7. The display device according to claim 6, wherein the display device comprises a display region including the first pixel and the second pixel, and
wherein the first pixel is disposed at position nearer a center of the display region than the second pixel.

8. The display device according to claim 1, wherein the display device comprises a display region including the first pixel and the second pixel, and
wherein the first pixel is disposed at position nearer a center of the display region than the second pixel.

9. The display device according to claim 1, wherein the first area is defined by a light shielding layer.

10. The display device according to claim 9, wherein the light shielding layer comprises a laminate of the first color filter and the second color filter.

11. The display device according to claim 9, wherein the light shielding layer comprises a light absorption material.

12. The display device according to claim 1, wherein a center of the fourth area is shifted from a center of a light emitting region of the second element of the second pixel in a planar view.

13. The display device according to claim 1, wherein the first light emitting element includes a lower electrode, a light emitting layer, and an upper electrode, and
wherein a transmittance peak wavelength of the first color filter is given by $$2L/(m-\phi/2\pi) \times 0.85 \leq \lambda \leq 2L/(m-\phi/2\pi) \times 1.15$$

where m is an integer not less than 0, $\phi$ is a phase shift in the lower electrode, $\lambda$ is the transmittance peak wavelength of the first color filter, and L is an optical distance from the light emitting layer to the lower electrode.

14. The display device according to claim 1, wherein the display device further comprises an image capturing device including a light receiving element, and
wherein a displayed image is controlled based on a line-of-sight information from the image capturing device.

15. An electronic device comprising:
an image capturing unit configured to capture an object; and
a display device according to claim 1, configured to display an image based on an image signal generated based on data output from the image capturing unit.

16. A moving body comprising:
an image capturing unit configured to capture an object; and
a display device according to claim 1, configured to display an image based on an image signal generated based on data output from the image capturing unit.

* * * * *